(12) United States Patent
Ikeda et al.

(10) Patent No.: US 11,742,232 B2
(45) Date of Patent: Aug. 29, 2023

(54) SUBSTRATE PROCESSING METHOD AND SUBSTRATE PROCESSING APPARATUS

(71) Applicant: Tokyo Electron Limited, Tokyo (JP)

(72) Inventors: Yoshinori Ikeda, Kumamoto (JP);
Shota Umezaki, Kumamoto (JP);
Shigeru Moriyama, Kumamoto (JP);
Ryo Yamamoto, Kumamoto (JP);
Takashi Uno, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/267,503

(22) PCT Filed: Jul. 26, 2019

(86) PCT No.: PCT/JP2019/029499
§ 371 (c)(1),
(2) Date: Feb. 10, 2021

(87) PCT Pub. No.: WO2020/039849
PCT Pub. Date: Feb. 27, 2020

(65) Prior Publication Data
US 2021/0313209 A1 Oct. 7, 2021

(30) Foreign Application Priority Data
Aug. 22, 2018 (JP) .................. 2018-155715

(51) Int. Cl.
*H01L 21/673* (2006.01)
*B08B 3/10* (2006.01)
(Continued)

(52) U.S. Cl.
CPC .......... *H01L 21/67393* (2013.01); *B08B 3/10* (2013.01); *H01L 21/02057* (2013.01); *H01L 21/67028* (2013.01)

(58) Field of Classification Search
CPC ......... H01L 21/67393; H01L 21/02057; H01L 21/67028; H01L 21/67051;
(Continued)

(56) References Cited

U.S. PATENT DOCUMENTS

| | | | |
|---|---|---|---|
| 6,539,959 B1 * | 4/2003 | Ohroku | .................... B08B 3/10 |
| | | | 134/1 |
| 2002/0123230 A1 * | 9/2002 | Hubacek | ............. H01J 37/3244 |
| | | | 438/712 |

(Continued)

FOREIGN PATENT DOCUMENTS

| | | |
|---|---|---|
| JP | 2001-319845 A | 11/2001 |
| JP | 2008-85164 A | 4/2008 |

(Continued)

OTHER PUBLICATIONS

International Search Report and Written Opinion dated Sep. 3, 2019, received for PCT Application PCT/JP2019/029499, Filed on Jul. 26, 2019, 9 pages including English Translation.

*Primary Examiner* — David G Cormier
*Assistant Examiner* — Thomas Bucci
(74) *Attorney, Agent, or Firm* — Xsensus LLP

(57) ABSTRACT

A substrate processing method according to an embodiment of the present disclosure includes a step of holding a substrate by a substrate holding unit (31) which is rotatable, a step of arranging a top plate portion (41) above the substrate, a step of supplying a processing liquid to the substrate, and a step of supplying a rinsing liquid (Lr) between the substrate and the top plate portion (41) to wash the substrate and the top plate portion (41) with the rinsing liquid (Lr).

4 Claims, 13 Drawing Sheets

(51) Int. Cl.
*H01L 21/02* (2006.01)
*H01L 21/67* (2006.01)

(58) Field of Classification Search
CPC . H01L 21/67017; H01L 21/6715; B08B 3/10; B08B 3/02; B08B 3/04; B08B 3/00
USPC .......................................................... 134/198
See application file for complete search history.

(56) References Cited

U.S. PATENT DOCUMENTS

| | | | |
|---|---|---|---|
| 2006/0021636 A1* | 2/2006 | Miya | B08B 3/04 |
| | | | 134/144 |
| 2007/0007244 A1* | 1/2007 | Hichri | G01M 3/226 |
| | | | 156/345.24 |
| 2008/0078426 A1 | 4/2008 | Miya et al. | |
| 2008/0230377 A1* | 9/2008 | Kiehlbauch | H01J 37/32091 |
| | | | 204/229.4 |
| 2009/0107522 A1* | 4/2009 | Uchida | H01L 21/67051 |
| | | | 134/3 |
| 2010/0196626 A1* | 8/2010 | Choi | H01J 37/32091 |
| | | | 427/569 |
| 2011/0052833 A1* | 3/2011 | Hanawa | C23C 16/45574 |
| | | | 134/1.1 |
| 2011/0303246 A1* | 12/2011 | Stiyer | B08B 3/04 |
| | | | 134/182 |
| 2012/0090647 A1 | 4/2012 | Miya et al. | |
| 2013/0052804 A1* | 2/2013 | Song | C23C 16/4411 |
| | | | 118/724 |
| 2013/0104940 A1* | 5/2013 | Nagamine | H01L 21/67051 |
| | | | 134/99.1 |
| 2014/0174483 A1 | 6/2014 | Miya et al. | |
| 2016/0141170 A1* | 5/2016 | Sato | H01L 21/67253 |
| | | | 134/57 R |

FOREIGN PATENT DOCUMENTS

| | | |
|---|---|---|
| JP | 2008-235301 A | 10/2008 |
| JP | 2013-98178 A | 5/2013 |

* cited by examiner

| NUMBER OF ROTATIONS OF WAFER (rpm) | EXHAUST PRESSURE (Pa) | INTERNAL PRESSURE IN FIRST SPACE (Pa) | OXYGEN CONCENTRATION IN PERIPHERAL PORTION OF WAFER (ppm) |
|---|---|---|---|
| 0 | <0 | >0 | 6 |
| 300 | <0 | >0 | 7 |
| 500 | <0 | >0 | 8 |
| 1000 | <0 | >0 | 14 |
| 1000 | <0 | >0 | 17 |
| 1500 | <0 | >0 | 70 |

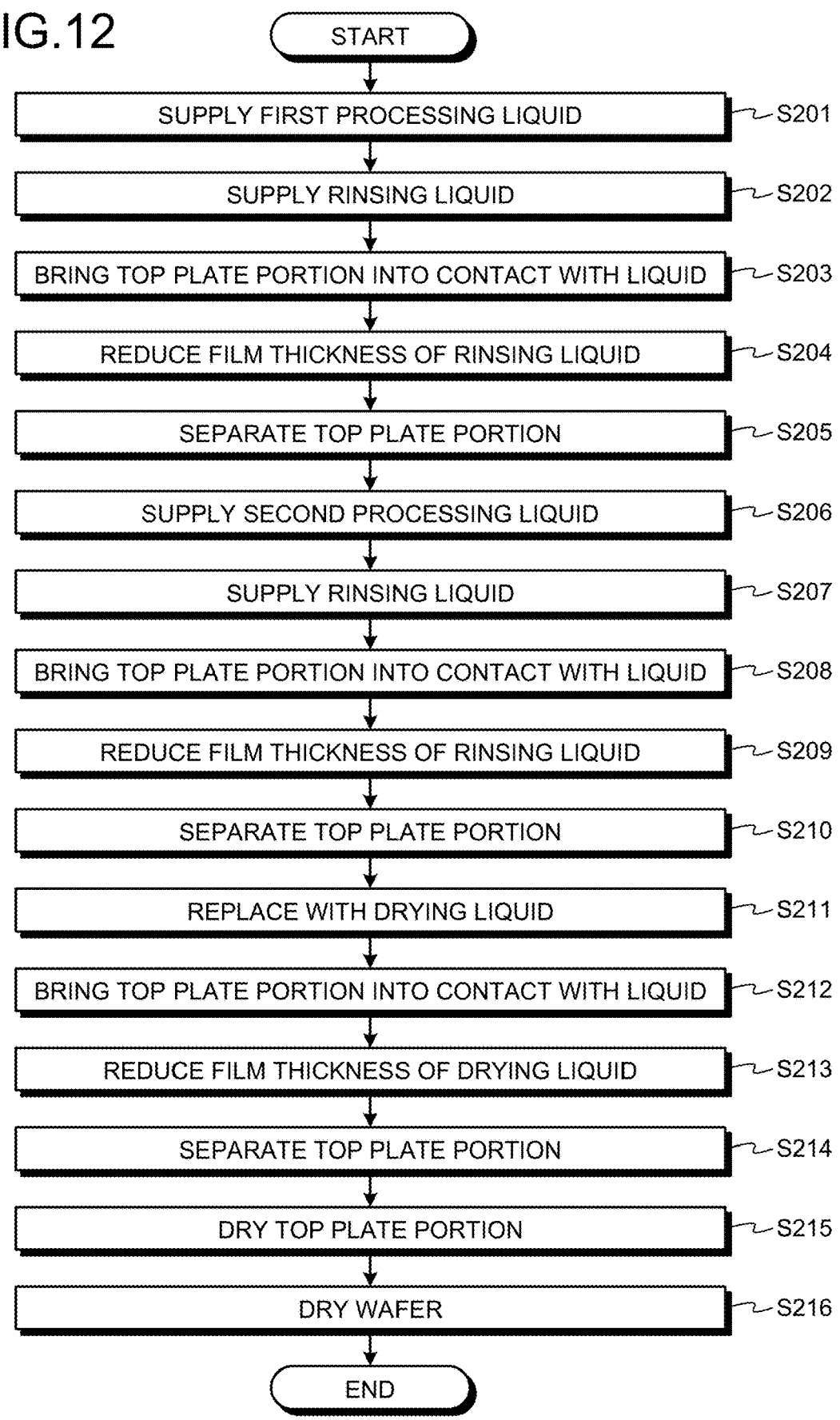

SUBSTRATE PROCESSING METHOD AND SUBSTRATE PROCESSING APPARATUS

CROSS-REFERENCE TO RELATED APPLICATIONS

This application is national stage application of International Application No. PCT/JP2019/029499, filed on Jul. 26, 2019, which designates the United States, incorporated herein by reference, and which claims the benefit of priority from Japanese Patent Application No. 2018-155715, filed on Aug. 22, 2018, the entire contents of each are incorporated herein by reference.

FIELD

The present disclosure relates to a substrate processing method and a substrate processing apparatus.

BACKGROUND

In a conventional substrate processing apparatus that performs processing of a substrate such as a semiconductor wafer (hereinafter referred to as a wafer), an ambient atmosphere purified by using a Fan Filter Unit (FFU) is supplied to the inside of the case (for example, refer to Patent Literature 1).

CITATION LIST

Patent Literature

Patent Literature 1: JP 2001-319845 A

SUMMARY

Solution to Problem

A substrate processing method according to an embodiment of the present disclosure includes a step of holding a substrate by a substrate holding unit which is rotatable, a step of arranging a top plate portion above the substrate, a step of supplying a processing liquid to the substrate, and a step of supplying a rinsing liquid between the substrate and the top plate portion to wash the substrate and the top plate portion with the rinsing liquid.

Advantageous Effects of Invention

BRIEF DESCRIPTION OF DRAWINGS

FIG. 12 is a flowchart illustrating a detailed process sequence of a series of liquid processing according to the embodiment.

DESCRIPTION OF EMBODIMENTS

Hereinafter, embodiments of a substrate processing method and a substrate processing apparatus disclosed in the present application will be described in detail with reference to the accompanying drawings. The present disclosure is not limited by the embodiments described below. Note that the drawings are schematic and thus the dimensional relationship of individual elements, the ratio of individual elements, or the like might differ from actual situations in some cases. Furthermore, the drawings may include portions having different dimensional relationships and ratios from each other.

In a conventional substrate processing apparatus for processing a substrate such as a wafer, an ambient atmosphere purified by using FFU is supplied to the inside of the case.

On the other hand, depending on the processing, the atmosphere surrounding the wafer is adjusted to predetermined conditions such as low humidity and low oxygen concentration, rather than the ambient atmosphere. However, entirely adjusting the atmosphere of the inside of the case using a gas that adjusts the atmosphere to predetermined conditions (hereinafter referred to as an atmosphere adjusting gas) might lead to a concern of an increase of the use amount of the atmosphere adjusting gas.

Therefore, it is expected to reduce the use amount of atmosphere adjusting gas at the time of processing the wafer in an atmosphere adjusted in accordance with processing conditions.

<Overview of Substrate Processing System>

Figure 1:
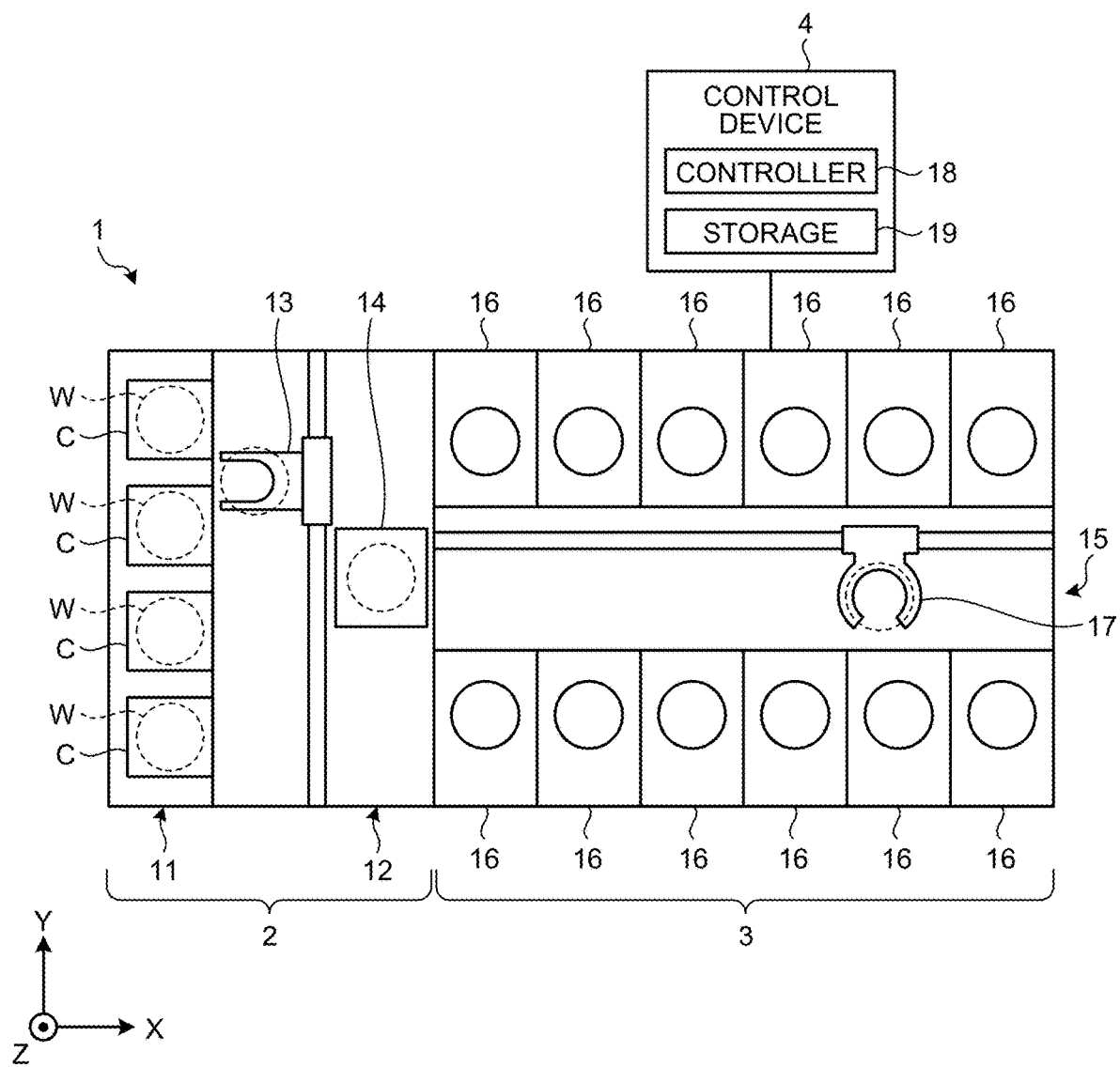
FIG. 1 is a schematic diagram illustrating a schematic configuration of a substrate processing system according to an embodiment.

First, a schematic configuration of a substrate processing system 1 according to an embodiment will be described with reference to FIG. 1. FIG. 1 is a schematic diagram illustrating the schematic configuration of the substrate processing system 1 according to the embodiment. In order to clarify the positional relationship, the X-axis, Y-axis, and Z-axis orthogonal to each other are defined in the following, and the positive Z-axis direction is defined as a vertical upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 includes a carrier placing section 11 and a transfer section 12. On the carrier placing section 11, a plurality of carriers C for accommodating a plurality of substrates, semiconductor wafers W (hereinafter referred to as wafers W) in the embodiment in a horizontal state are placed. The wafer W is an example of a substrate.

The transfer section 12 is provided adjacent to the carrier placing section 11, and internally includes a substrate transfer device 13 and a delivery unit 14. The substrate transfer device 13 includes a wafer holding mechanism that holds the wafer W. Furthermore, the substrate transfer device 13 can move in the horizontal direction and the vertical direction and can turn around a vertical axis, and transfers the wafer W between the carrier C and the delivery unit 14 by using the wafer holding mechanism.

The processing station 3 is provided adjacent to the transfer section 12. The processing station 3 includes a transfer section 15 and a plurality of processing units 16. The plurality of processing units 16 are provided side by side on both sides of the transfer section 15. The processing unit 16 is an example of a substrate processing apparatus.

The transfer section 15 includes a substrate transfer device 17 inside. The substrate transfer device 17 includes a wafer holding mechanism that holds the wafer W. Furthermore, the substrate transfer device 17 can move in the horizontal direction and the vertical direction and can turn around a vertical axis, and transfers the wafer W between the delivery unit 14 and the processing unit 16 by using the wafer holding mechanism.

The processing unit 16 performs a predetermined liquid processing on the wafer W transferred by the substrate transfer device 17. Details of the processing unit 16 will be described below.

Furthermore, the substrate processing system 1 includes a control device 4. The control device 4 is, for example, a computer, and includes a controller 18 and storage 19. The storage 19 stores programs that control various types of processing executed in the substrate processing system 1. By reading and executing the program stored in the storage 19, the controller 18 controls the operation of the substrate processing system 1.

The program may be recorded on a computer-readable storage medium, and may be installed from the storage medium onto the storage 19 of the control device 4. Examples of the computer-readable storage medium include a hard disk (HD), a flexible disk (FD), a compact disc (CD), a magnetic optical disc (MO), and a memory card.

In the substrate processing system 1 configured as described above, the substrate transfer device 13 of the carry-in/out station 2 first takes out the wafer W from the carrier C mounted on the carrier placing section 11 and places the taken out wafer W on the delivery unit 14. The wafer W placed on the delivery unit 14 is taken out from the delivery unit 14 by the substrate transfer device 17 of the processing station 3 and carried into the processing unit 16.

The wafer W carried into the processing unit 16 is processed by the processing unit 16, then carried out from the processing unit 16 by the substrate transfer device 17, so as to be placed on the delivery unit 14. The processed wafer W placed on the delivery unit 14 is returned to the carrier C of the carrier placing section 11 by the substrate transfer device 13.

<Overview of Processing Unit>

Figure 2:
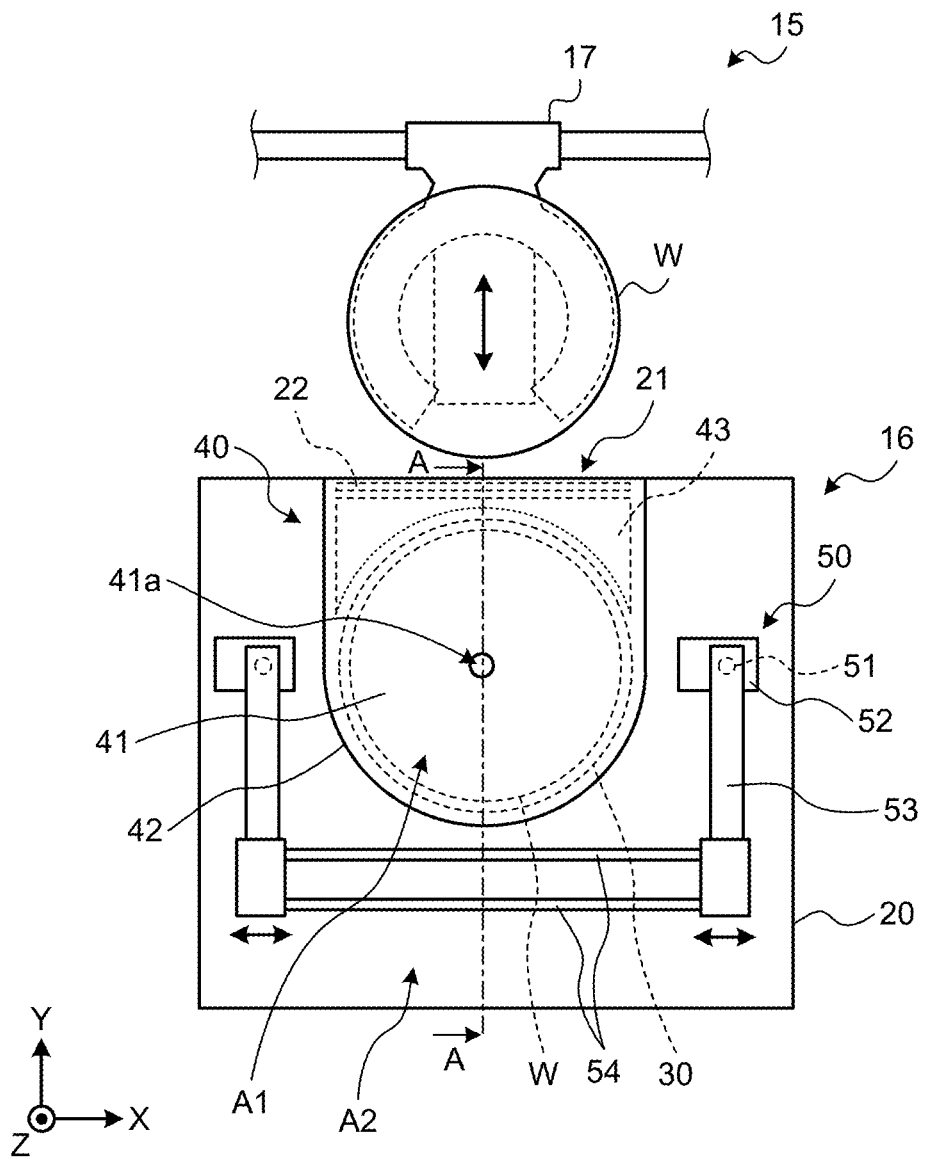
FIG. 2 is a top view illustrating a configuration of a processing unit according to the embodiment.
Figure 3:
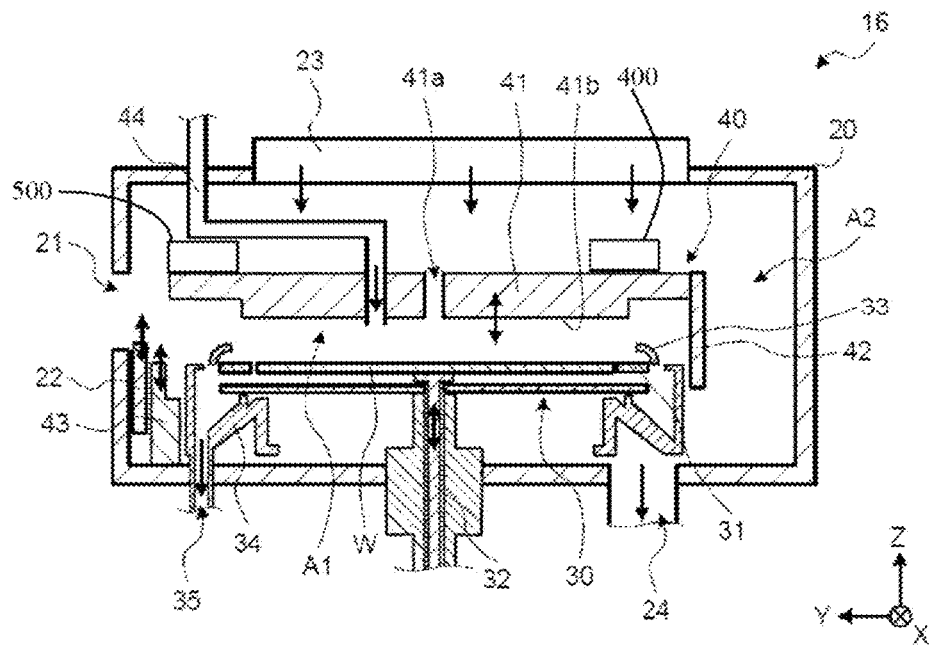
FIG. 3 is a cross-sectional view taken along line A-A in FIG. 2.

Next, the outline of the processing unit 16 will be described with reference to FIGS. 2 and 3. FIG. 2 is a top view illustrating the configuration of the processing unit 16 according to the embodiment, and FIG. 3 is a cross-sectional view taken along line A-A in FIG. 2. For ease of understanding, FIG. 3 illustrates a state in which the wafer W has been carried in while omitting illustration of a Linear Motion (LM) guide 54.

As illustrated in FIG. 2, the processing unit 16 includes a case 20, a substrate processing section 30, a partition wall 40, and a liquid supply section 50. The case 20 accommodates the substrate processing section 30, the partition wall 40, and the liquid supply section 50.

The case 20 has a carry-in/out port 21 at a position coming in contact with the transfer section 15. The wafer W transferred by the substrate transfer device 17 of the transfer section 15 is carried to the inside of the case 20 from the carry-in/out port 21. Furthermore, the case 20 includes a shutter 22 that can open and close the carry-in/out port 21.

As illustrated in FIG. 3, an FFU 23 is provided on the ceiling of the case 20. The FFU 23 forms a downflow of the purified ambient atmosphere supplied within the case 20. Furthermore, the bottom of the case 20 is provided with an exhaust port 24 for exhausting the ambient atmosphere supplied from the FFU 23 to the outside of the processing unit 16.

The substrate processing section 30 applies a predetermined liquid processing on the wafer W. As illustrated in FIG. 3, the substrate processing section 30 includes a substrate holding unit 31, a supporting unit 32, a liquid receiving cup 33, a recovery cup 34, and a drain port 35. The substrate holding unit 31 holds the wafer W horizontally. The substrate holding unit 31 holds an outer edge of the wafer W from the side.

The supporting unit 32 is a member extending in the vertical direction, and its bottom end is rotatably supported by a driving unit (not illustrated). Furthermore, although not illustrated in FIG. 3, the supporting unit 32 can horizontally support the substrate holding unit 31 at a leading end on the upper side.

By rotating the supporting unit 32 using the driving unit, the substrate processing section 30 rotates the substrate holding unit 31 supported by the supporting unit 32. With this operation, the substrate processing section 30 rotates the wafer W held by the substrate holding unit 31. Furthermore, with a configuration to be movable up and down, the supporting unit 32 can move toward the wafer W carried in above the substrate processing section 30 and receive the wafer W.

The liquid receiving cup 33 has a substantially annular shape and has a curved shape recessed downward. The liquid receiving cup 33 is arranged so as to surround the outer edge of the substrate holding unit 31, and collects a processing liquid, a rinsing liquid Lr (refer to FIG. 7B), a drying liquid Ld (refer to FIG. 7K), and the like scattered from the wafer W due to the rotation of the substrate holding unit 31. For example, the liquid receiving cup 33 is arranged so as to surround the outer edge of the substrate holding unit 31 at least above the same plane of the wafer W held by the substrate holding unit 31.

The recovery cup 34 is arranged so as to surround the substrate holding unit 31, and collects the processing liquid, the rinsing liquid Lr, the drying liquid Ld, and the like scattered from the wafer W by the rotation of the substrate holding unit 31. Although not illustrated in FIG. 3, the recovery cup 34 may be a multi-cup capable of collecting a plurality of types of processing liquid, rinsing liquid Lr, drying liquid Ld, and the like, individually.

This recovery cup 34 has the drain port 35 at the bottom. The processing liquid, the rinsing liquid Lr, the drying liquid Ld, and the like collected by the liquid receiving cup 33 or the recovery cup 34 are discharged to the outside of the processing unit 16 from the drain port 35.

The partition wall 40 partitions the inside of the case 20 into a first space A1 from the above-mentioned carry-in/out port 21 to the substrate processing section 30 and a second space A2 other than the first space A1. Furthermore, the partition wall 40 is capable of adjusting the atmosphere in the partitioned first space A1 to a predetermined condition.

As illustrated in FIG. 3, the partition wall 40 includes a top plate portion 41, a side wall portion 42, a gap filling portion 43, and a gas supply unit 44. The top plate portion 41 has a substantially disc-like shape and is provided to face substantially parallel to the wafer W held by the substrate holding unit 31, so as to be arranged to cover the upper side of the wafer W.

Furthermore, the top plate portion 41 is movable up and down in the case 20 via a top plate movement driver 400 controlled by the controller 18. When the wafer W is carried in and out from the carry-in/out port 21, the top plate portion 41 moves upward to avoid interfering with the conveying path of the wafer W. In addition, when the wafer W is processed by the substrate processing section 30, the top plate portion 41 moves to a lower position that comes in close proximity to the wafer W. The arrangement of the top plate portion 41 is not limited to the above-described position, and can be freely changed depending on the conditions for processing the wafer W and the conditions for washing the top plate portion 41.

The top plate portion 41 has a through hole 41a that communicates in the up-down directions. For example, as illustrated in FIG. 2, the through hole 41a has a substantially circular shape, and is formed so as to face at least a central portion of the wafer W held by the substrate holding unit 31. Furthermore, the through hole 41a is formed to allow insertion of a processing liquid nozzle 51, which will be described below.

Furthermore, as illustrated in FIG. 3, the top plate portion 41 has a protrusion 41b protruding toward the wafer W. The protrusion 41b protrudes in a substantially columnar shape, for example. The protrusion 41b has an outer diameter larger than an outer diameter of an opposing wafer W and smaller than an inner diameter of the adjacent liquid receiving cup 33.

The side wall portion 42 surrounds the sides of the substrate holding unit 31 that holds the wafer W, the liquid receiving cup 33, the top plate portion 41, and the like. As illustrated in FIG. 2, for example, in top view, the side wall portion 42 has a linear shape on the front side where the carry-in/out port 21 is located, and has a semicircular shape to follow the shape of the wafer W on the back side where the wafer W undergoes liquid processing.

In the embodiment, the side wall portion 42 can move up and down integrally with the top plate portion 41. However, the side wall portion 42 does not need to move up and down together with the top plate portion 41, and may be fixed in the case 20. In this case, the top plate portion 41 is to be configured to be movable up and down along the fixed side wall portion 42.

When the wafer W is processed by the substrate processing section 30, the gap filling portion 43 fills a gap (for example, vicinities of the carry-in/out port 21) other than the substrate processing section 30 in the first space A1. Furthermore, the gap filling portion 43 is movable in the case 20. When the wafer W is carried in and out from the carry-in/out port 21, the gap filling portion 43 moves to a position avoiding interfering with the conveying path of the wafer W. As illustrated in FIG. 2, for example, the gap filling portion 43 has a substantially U-shape with an arc shape on the inside and a rectangular shape on the outside in top view.

The gas supply unit 44 is connected to the first space A1 and supplies the atmosphere adjusting gas to the first space A1. For example, the atmosphere adjusting gas discharge nozzle in the gas supply unit 44 is provided at a position adjacent to the through hole 41a of the top plate portion 41. The atmosphere adjusting gas may be supplied from a second gas supply unit (not illustrated) provided in the transfer section 15, via the transfer section 15.

Furthermore, the atmosphere adjusting gas in the embodiment is, for example, an inert gas having a lower oxygen concentration than the ambient atmosphere, such as nitrogen gas or Ar gas, or a gas having a lower humidity than the ambient atmosphere, such as a dry gas.

The liquid supply section 50 illustrated in FIG. 2 supplies the processing liquid, the rinsing liquid Lr, the drying liquid Ld, and the like to the wafer W held in the first space A1. The liquid supply section 50 includes a processing liquid nozzle 51, a nozzle bath 52, an arm 53, an LM guide 54, and a static eliminator 500, and is arranged in the second space A2.

The processing liquid nozzle 51 is connected to a processing liquid supply source via a valve and a flow controller (not illustrated), and discharges the processing liquid, the rinsing liquid Lr, the drying liquid Ld, and the like to the wafer W by using the through hole 41a formed in the top plate portion 41.

The processing liquid discharged from the processing liquid nozzle 51 includes various liquids used for various types of liquid processing on the wafer W, such as an acid processing liquid, an alkaline processing liquid, and an organic processing liquid. An example of the acid processing liquid is Diluted Hydro Fluoric acid (DHF). An example of the alkaline processing liquid is SC1 (mixed solution of ammonia, hydrogen peroxide, and water).

The rinsing liquid Lr discharged from the processing liquid nozzle 51 dilutes the processing liquid on the wafer W and washes the wafer W. Examples of the rinsing liquid Lr include Deionized Water (DIW) or ammonia water.

The drying liquid Ld discharged from the processing liquid nozzle 51 replaces the rinsing liquid Lr on the wafer W, thereby drying the wafer W. An example of the drying liquid Ld is IsoPropyl Alcohol (IPA).

The nozzle bath 52 is a container for allowing the processing liquid nozzle 51 to stand by at a standby position and for dummy dispensing the processing liquid, the rinsing liquid Lr, and the drying liquid Ld from the processing liquid nozzle 51. The arm 53 supports the processing liquid nozzle 51.

The LM guide 54 guides the arm 53 in the X-axis direction. With a driving force transmitted from a driving unit (not illustrated) included in the LM guide 54, the arm 53 guided by the LM guide 54 slides along the LM guide 54 together with the processing liquid nozzle 51. This enables the processing liquid nozzle 51 to make a sliding movement to a predetermined position in the case 20.

Furthermore, the arm 53 is provided with a lifting/lowering mechanism (not illustrated). The liquid supply section 50 can lift and lower the processing liquid nozzle 51 by operating the lifting/lowering mechanism.

In this manner, by operating the LM guide 54 and the lifting/lowering mechanism, the liquid supply section 50 can move the processing liquid nozzle 51 to the position of the through hole 41a to be inserted through the through hole 41a.

A static eliminator 500 can perform static elimination of the processing liquid, the rinsing liquid Lr, the drying liquid Ld, and the like discharged from the processing liquid nozzle 51. Furthermore, in order to prevent the top plate portion 41 from being charged due to contact with the processing liquid, the rinsing liquid Lr, and the drying liquid Ld that splashed on the wafer W, the static eliminator 500 also perform static elimination of the top plate portion 41. Examples of such a static eliminator include a grounding wire or an ionizer provided on the top plate portion 41.

Although the example illustrated in FIG. 2 is a case where two sets of the processing liquid nozzle 51, the nozzle bath 52, and the arm 53 are provided, the number of the processing liquid nozzle 51, the nozzle bath 52, and the arm 53 provided in the processing unit 16 is not limited to the two sets, and a predetermined number can be provided.

Furthermore, the example illustrated in FIG. 2 is a case where the processing liquid nozzle 51 is fixed to the arm 53. However, the processing liquid nozzle 51 need not be fixed to the arm 53. For example, the processing liquid nozzle 51 may be a pickup type nozzle or the like, in which the arm 53 grips and moves the processing liquid nozzle 51. Furthermore, the mechanism for sliding the arm 53 is not limited to the LM guide 54, and various known mechanisms can be used.

In the above embodiment, when processing the wafer W, the use amount of the atmosphere adjusting gas is reduced by minimizing the volume of the first space A1.

<Details of Substrate Processing>

Figure 4:
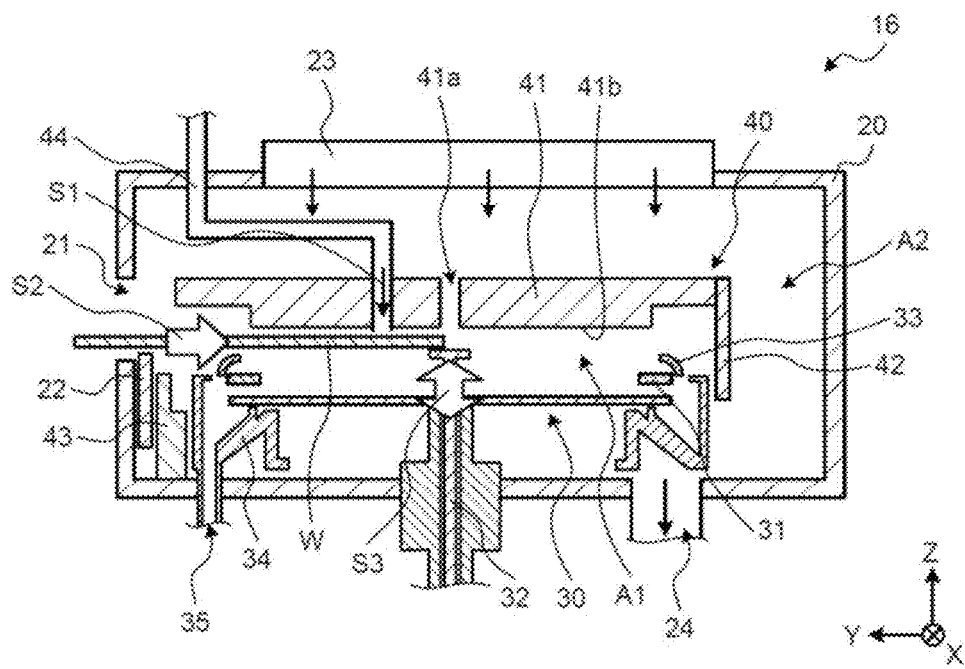
FIG. 4 is a schematic diagram (1) illustrating one step of substrate processing according to the embodiment.
Figure 5:
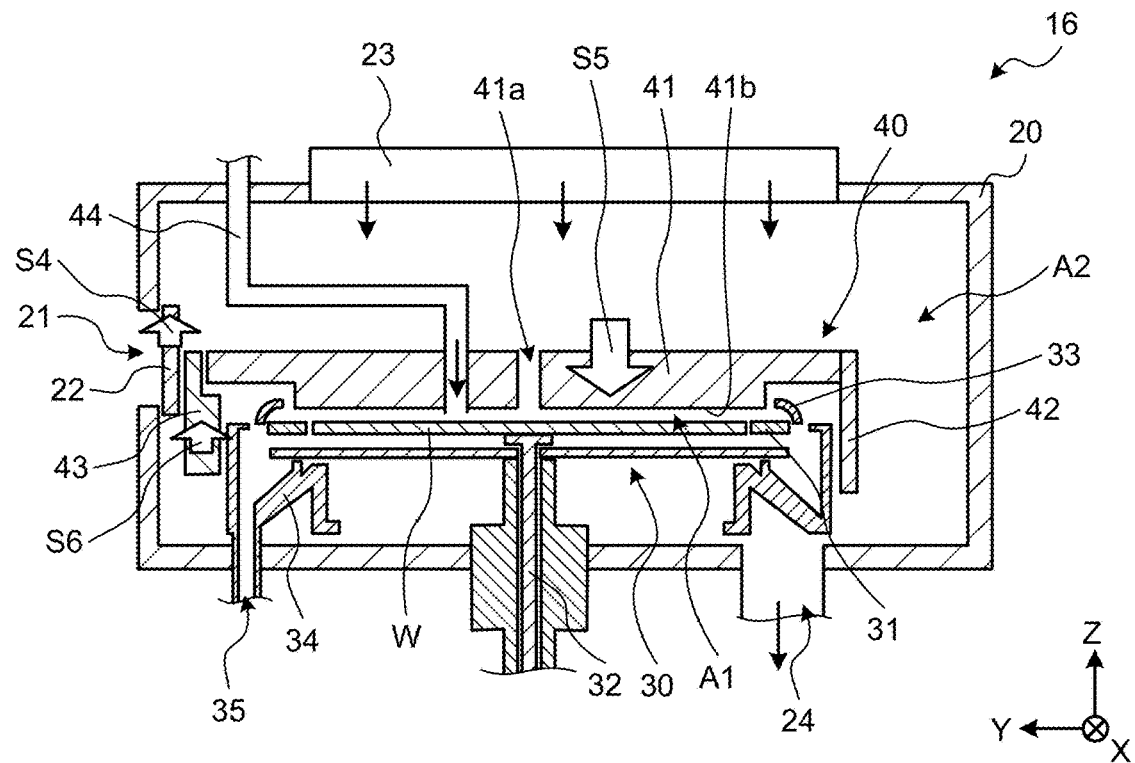
FIG. 5 is a schematic diagram (2) illustrating one step of the substrate processing according to the embodiment.
Figure 6:
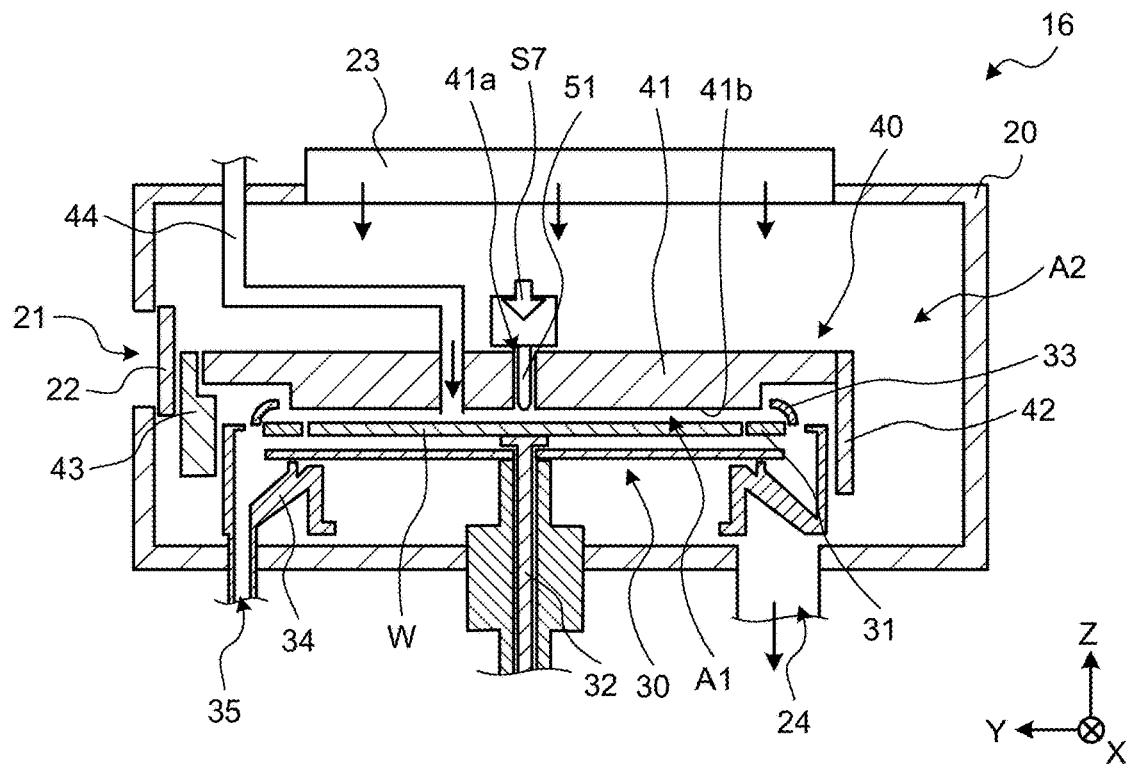
FIG. 6 is a schematic diagram (3) illustrating one step of the substrate processing according to the embodiment.

Subsequently, details of the substrate processing according to the embodiment will be described with reference to FIGS. 4 to 7O. FIGS. 4 to 6 are schematic diagrams (1) to (3) illustrating one step of the substrate processing according to the embodiment.

As illustrated in FIG. 4, the processing unit 16 ensures a conveying path for the wafer W in the first space A1 prior to carrying the wafer W into the substrate processing section 30. Specifically, the processing unit 16 retracts the top plate portion 41 upward from the wafer W conveying path and retracts the gap filling portion 43 downward.

Furthermore, the processing unit 16 supplies a predetermined atmosphere adjusting gas to the first space A1 by using the gas supply unit 44 at a predetermined timing before the wafer W is carried into the substrate processing section 30 (step S1). This enables the processing unit 16 to replace the atmosphere in the first space A1 with the atmosphere adjusting gas in advance.

Meanwhile, the second space A2 of the processing unit 16 is an ambient atmosphere purified by the FFU 23. The atmosphere adjusting gas supplied to the first space A1 and the ambient atmosphere supplied to the second space A2 are both exhausted at the exhaust port 24.

Next, the processing unit 16 moves the shutter 22 to open the carry-in/out port 21. Subsequently, the substrate transfer device 17 carries the wafer W into the substrate processing section 30 in the processing unit 16 (step S2). Furthermore, the processing unit 16 uses the supporting unit 32 moved upward to receive the wafer W carried up to the upper part of the substrate holding unit 31, then, moves the wafer W downward so as to hold the wafer W by the substrate holding unit 31 (step S3).

Next, as illustrated in FIG. 5, the processing unit 16 moves the shutter 22 to close the carry-in/out port 21 (step S4). Furthermore, the processing unit 16 moves the top plate portion 41 downward to bring it closer to the wafer W (step S5). For example, in step S5, the top plate portion 41 is brought close to the position where the gap between the wafer W and the top plate portion 41 is approximately 4 mm.

Furthermore, the processing unit 16 moves the gap filling portion 43 upward to fill the gap other than the substrate processing section 30 in the first space A1 (step S6). The order of steps S4 to S6 illustrated in FIG. 5 is optional. For example, steps S4 to S6 may be performed at the same time.

In the embodiment, during the steps S4 to S6, the processing unit 16 operates the gas supply unit 44 to continue supplying a predetermined atmosphere adjusting gas to the first space A1. This enables the atmosphere of the first space A1 in which the wafer W is disposed to be continuously adjusted to a predetermined condition.

Next, as illustrated in FIG. 6, by operating the liquid supply section 50, the processing unit 16 moves the processing liquid nozzle 51 to a predetermined position on the wafer W so as to insert the wafer W into the through hole 41a (step S7). By operating the processing liquid nozzle 51 or the like, the processing unit 16 performs a series of liquid processing on the wafer W.

Figure 7A:
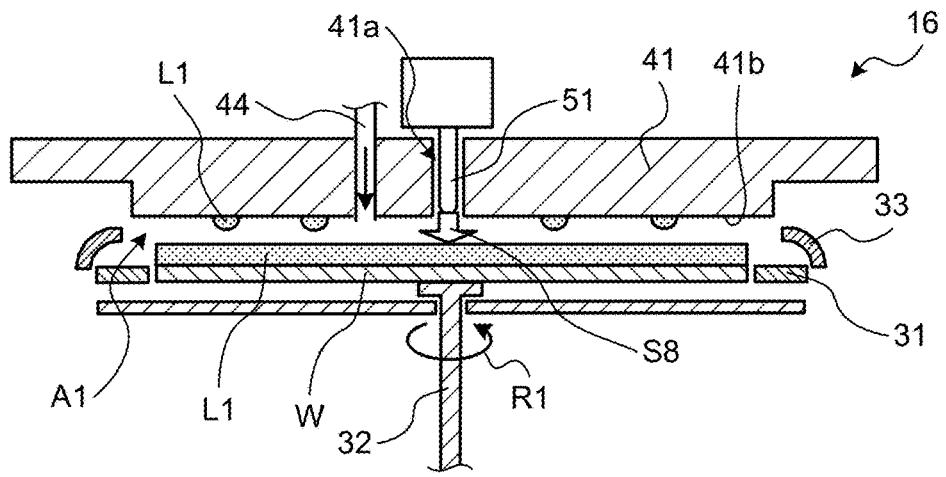
FIG. 7A is a schematic diagram (1) illustrating one step of liquid processing according to the embodiment.

Subsequently, the details of the series of liquid processing will be described with reference to FIGS. 7A to 7O. FIGS. 7A to 7O are schematic diagrams (1) to (15) illustrating one step of the liquid processing according to the embodiment. Note that FIGS. 7A to 7O are enlarged views of vicinities of the wafer W and the top plate portion 41 of the processing unit 16.

As illustrated in FIG. 7A, by operating the processing liquid nozzle 51, the processing unit 16 supplies a first processing liquid L1 which is a predetermined processing liquid, between the wafer W and the top plate portion 41 (step S8). At this time, by operating the substrate holding unit 31, the processing unit 16 rotates the wafer W at a predetermined number of rotations R1 (for example, approximately 500 rpm).

This allows the first processing liquid L1 to move to the outer peripheral side of the wafer W, causing the wafer W to be processed with the first processing liquid L1. Furthermore, when the wafer W is processed with the first processing liquid L1, the first processing liquid L1 splashed from the wafer W adheres to the protrusion 41b of the top plate portion 41.

Furthermore, as illustrated in FIG. 7A, during the process with the first processing liquid L1, the processing unit 16 continues to supply a predetermined atmosphere adjusting gas to the first space A1 by using the gas supply unit 44. As a result, the wafer W can be processed with the first processing liquid L1 in an atmosphere adjusted to a predetermined condition.

Figure 7B:
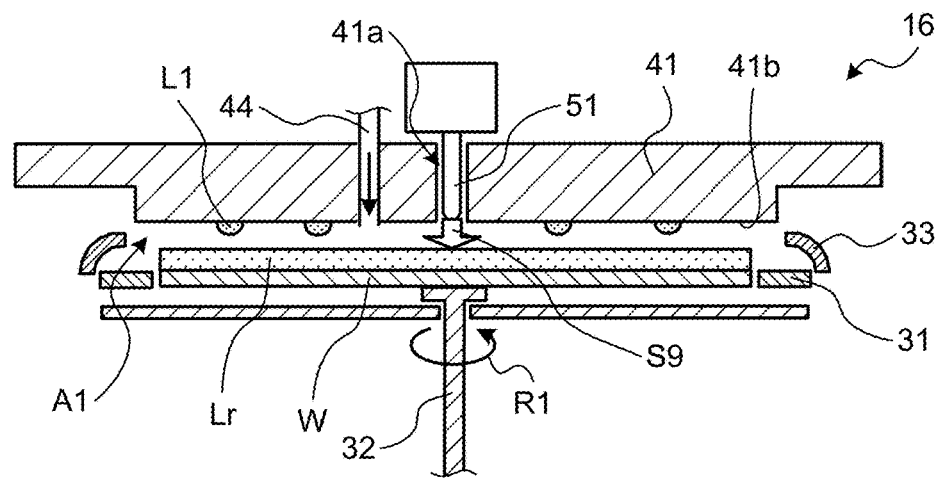
FIG. 7B is a schematic diagram (2) illustrating one step of the liquid processing according to the embodiment.

Next, as illustrated in FIG. 7B, by operating the processing liquid nozzle 51, the processing unit 16 supplies a predetermined rinsing liquid Lr between the wafer W and the top plate portion 41 (step S9). At this time, the processing unit 16 rotates the wafer W at the predetermined number of rotations R1.

This dilutes the first processing liquid L1 on the wafer W, so as to perform a washing process on the wafer W. As illustrated in FIG. 7B, when the wafer W is processed with the rinsing liquid Lr, the processing unit 16 continues to supply a predetermined atmosphere adjusting gas to the first space A1 by using the gas supply unit 44.

Figure 7C:
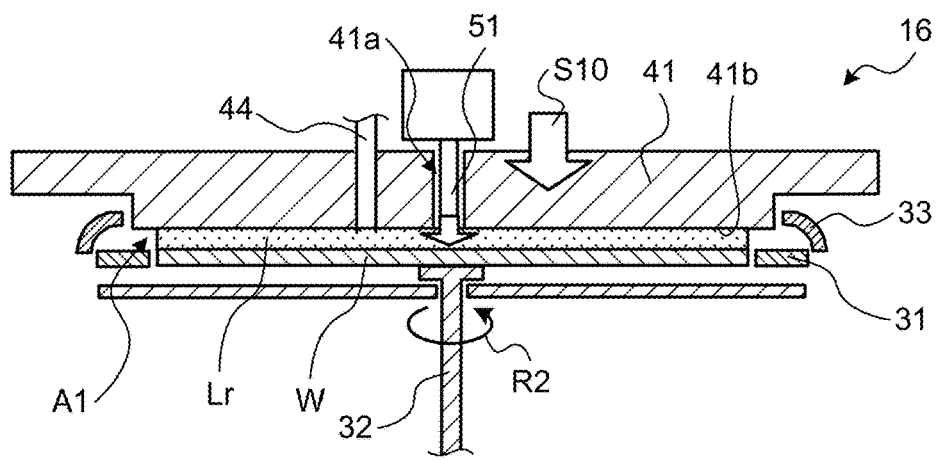
FIG. 7C is a schematic diagram (3) illustrating one step of the liquid processing according to the embodiment.

Next, as illustrated in FIG. 7C, the processing unit 16 lowers the top plate portion 41 to bring it closer to the wafer W while supplying the rinsing liquid Lr between the wafer W and the top plate portion 41, thereby bringing the protrusion 41b of the top plate portion 41 into contact with the rinsing liquid Lr on the wafer W (step S10).

In step S10, the gap between the wafer W and the top plate portion 41 is approximately 1 mm, for example. At this time, the processing unit 16 rotates the wafer W at a predetermined number of rotations R2 (for example, approximately 30 rpm) smaller than the number of rotations R1.

By supplying the rinsing liquid Lr so as to fill the space between the wafer W and the top plate portion 41 in this manner, the first processing liquid L1 adhering to the protrusion 41b of the top plate portion 41 can be diluted with the rinsing liquid Lr. Therefore, according to the embodiment, it is possible to perform the washing process on the protrusion 41b of the top plate portion 41 to which the first processing liquid L1 adheres.

In the present embodiment, in order to reduce the use amount of atmosphere adjusting gas, the space between the wafer W and the top plate portion 41 is formed into a narrow space, thereby minimizing the volume of the first space A1. However, performing the liquid processing while maintaining the space between the wafer W and the top plate portion 41 to a narrow space might cause the processing liquid to adhere to the top plate portion 41. Accordingly, in the embodiment, performing the washing process on the top plate portion 41 makes it possible to reduce the adverse effect of the processing liquid adhering to the top plate portion 41.

Furthermore, in the embodiment, it is preferable, at execution of step S10, to stop the supply of the atmosphere adjusting gas to the first space A1 using the gas supply unit 44. Supplying the atmosphere adjusting gas directly to the rinsing liquid Lr from the nozzle while the top plate portion 41 is in contact with the rinsing liquid Lr might cause air bubbles to be mixed in the rinsing liquid Lr.

Fortunately, however, in the embodiment, since the supply of the atmosphere adjusting gas is stopped when the top plate portion 41 is in contact with the liquid, it is possible to suppress the mixing of air bubbles in the rinsing liquid Lr.

Note that it is not always necessary, in the embodiment, to stop the supply of the atmosphere adjusting gas while the top plate portion 41 is in contact with the liquid. For example, in a case where there would be no influence on the processing, even with air bubbles mixed in the rinsing liquid Lr, it is allowable to continue the supply of the atmosphere adjusting gas in a state where the top plate portion 41 is in contact with the liquid.

Furthermore, in the embodiment, it is preferable to perform static elimination of the rinsing liquid Lr by using the static elimination mechanism of the liquid supply section 50 and thereafter supply the rinsing liquid Lr onto the wafer W at execution of step S10. With this procedure, when the wafer W is rotated with the top plate portion 41 in contact with the liquid, it is possible to suppress electrical charging of the top plate portion 41 by the rinsing liquid Lr.

The method of suppressing the electrical charging of the top plate portion 41 by the rinsing liquid Lr is not limited to the case of performing static elimination of the rinsing liquid Lr by the static elimination mechanism of the liquid supply section 50. For example, the top plate portion 41 may be formed of a conductive material and the top plate portion 41 may be grounded.

Figure 7D:
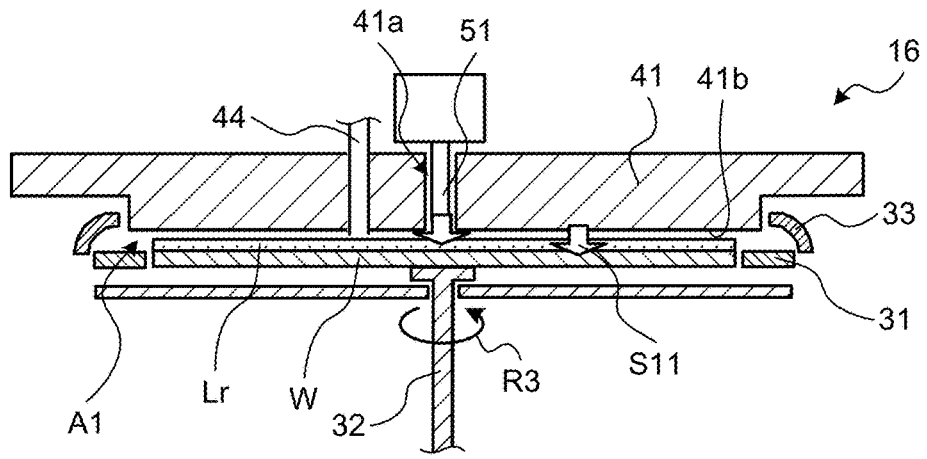
FIG. 7D is a schematic diagram (4) illustrating one step of the liquid processing according to the embodiment.

Next, as illustrated in FIG. 7D, the processing unit 16 increases the number of rotations of the wafer W from a predetermined number of rotations R2 to a predetermined number of rotations R3 (for example, approximately 500 rpm). This enables the processing unit 16 to reduce the film thickness of the rinsing liquid Lr on the wafer W, canceling the state in which the protrusion 41b of the top plate portion 41 is in contact with the rinsing liquid Lr (step S11).

Figure 7E:
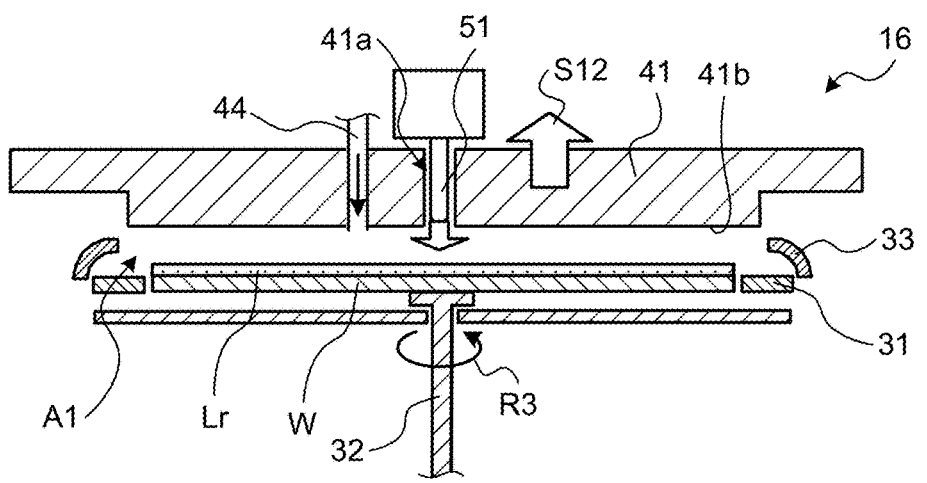
FIG. 7E is a schematic diagram (5) illustrating one step of the liquid processing according to the embodiment.

Subsequently, as illustrated in FIG. 7E, the processing unit 16 raises the top plate portion 41 to separate it from the wafer W (step S12). For example, in step S12, the top plate portion 41 is separated at a position where the gap between the wafer W and the top plate portion 41 is approximately 4 mm.

In this manner, in the embodiment, the film thickness of the rinsing liquid Lr on the wafer W is reduced to cancel the state in which the top plate portion 41 is in contact with the liquid, and thereafter the top plate portion 41 is separated from the wafer W. In a case where the top plate portion 41 is raised while the top plate portion 41 is in contact with the rinsing liquid Lr, the wafer W would be in a state of adhering to the top plate portion 41 via the rinsing liquid Lr, leading to a concern that the wafer W would rise together with the top plate portion 41.

Fortunately, however, in the embodiment, the liquid contact state of the top plate portion 41 is canceled first and thereafter the top plate portion 41 is separated from the wafer W. This makes it possible to suppress rising of the wafer W adhering to the top plate portion 41 via the rinsing liquid Lr together with the rising of the top plate portion 41.

When the state where the top plate portion 41 is in contact with liquid is canceled, the processing unit 16 resumes the supply of the atmosphere adjusting gas to the first space A1 using the gas supply unit 44. This enables the atmosphere around the wafer W that undergoes liquid processing to be continuously adjusted to a predetermined condition.

Figure 7F:
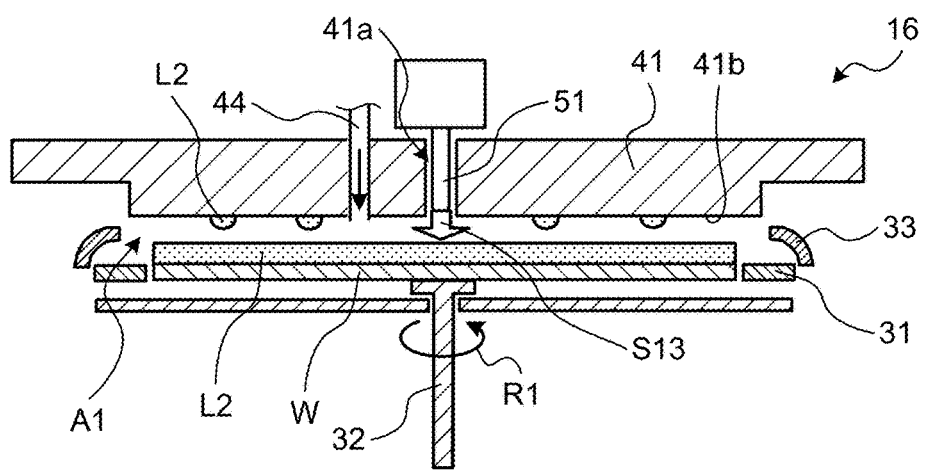
FIG. 7F is a schematic diagram (6) illustrating one step of the liquid processing according to the embodiment.

Next, as illustrated in FIG. 7F, by operating the processing liquid nozzle 51, the processing unit 16 supplies a second processing liquid L2, which is a predetermined processing liquid, between the wafer W and the top plate portion 41 (step S13). At this time, by operating the substrate holding unit 31, the processing unit 16 rotates the wafer W at the predetermined number of rotations R1.

This allows the second processing liquid L2 to move to the outer peripheral side of the wafer W, causing the wafer W to be processed with the second processing liquid L2. Furthermore, when the wafer W is processed with the second processing liquid L2, the second processing liquid L2 splashed from the wafer W adheres to the protrusion 41b of the top plate portion 41.

At this time, the processing unit 16 continues to supply a predetermined atmosphere adjusting gas to the first space A1 by using the gas supply unit 44.

Figure 7G:
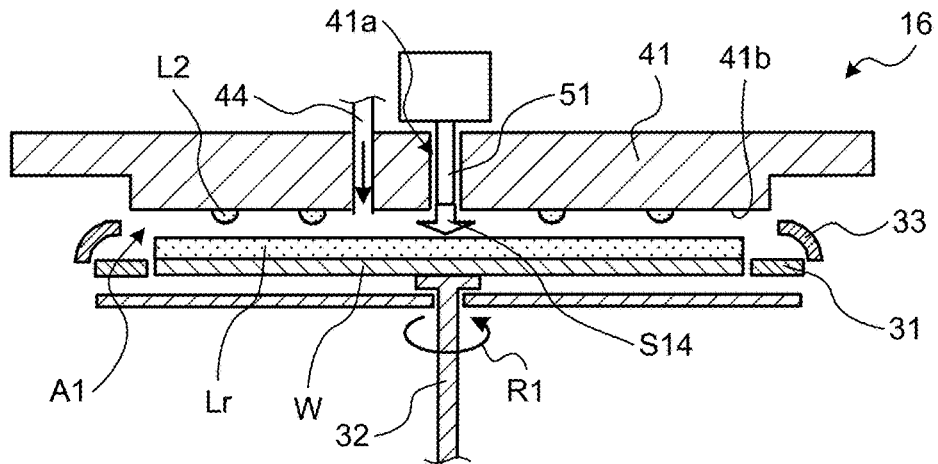
FIG. 7G is a schematic diagram (7) illustrating one step of the liquid processing according to the embodiment.

Next, as illustrated in FIG. 7G, by operating the processing liquid nozzle 51, the processing unit 16 supplies a predetermined rinsing liquid Lr between the wafer W and the top plate portion 41 (step S14). At this time, the processing unit 16 rotates the wafer W at the predetermined number of rotations R1.

This dilutes the second processing liquid L2 on the wafer W, leading to execution of the washing process on the wafer W. At this time, the processing unit 16 continues to supply a predetermined atmosphere adjusting gas to the first space A1 by using the gas supply unit 44.

Figure 7H:
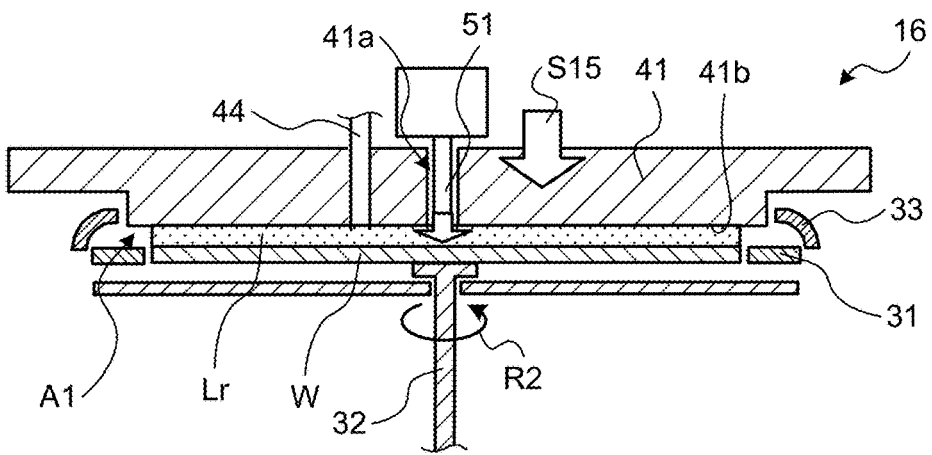
FIG. 7H is a schematic diagram (8) illustrating one step of the liquid processing according to the embodiment.

Next, as illustrated in FIG. 7H, the processing unit 16 lowers the top plate portion 41 to bring it closer to the wafer W while supplying the rinsing liquid Lr between the wafer W and the top plate portion 41, thereby bringing the protrusion 41b of the top plate portion 41 into contact with the rinsing liquid Lr on the wafer W (step S15).

With this procedure, the second processing liquid L2 adhering to the protrusion 41b of the top plate portion 41 can be diluted with the rinsing liquid Lr. Therefore, according to the embodiment, it is possible to perform the washing process on the protrusion 41b of the top plate portion 41 to which the second processing liquid L2 adheres.

In step S15, the processing unit 16 rotates the wafer W at the predetermined number of rotations R2 smaller than the number of rotations R1. Furthermore, since step S15 is a process similar to step S10 illustrated in FIG. 7C, other duplicate descriptions will be omitted.

Figure 7I:
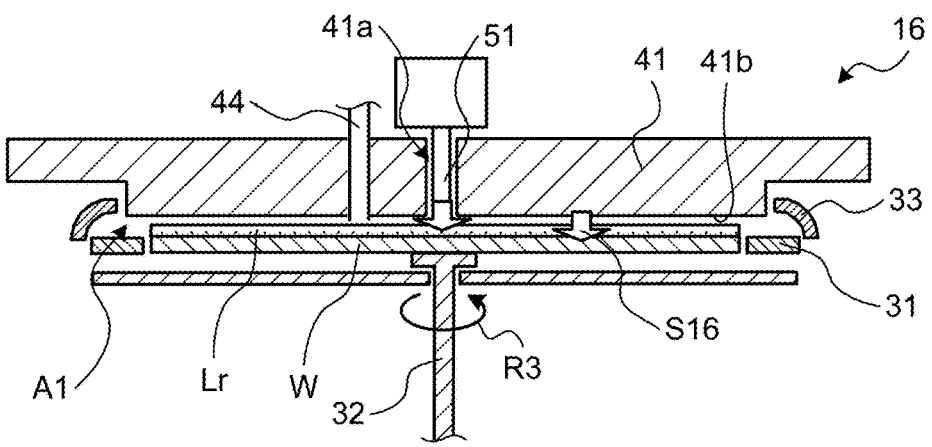
FIG. 7I is a schematic diagram (9) illustrating one step of the liquid processing according to the embodiment.

Next, as illustrated in FIG. 7I, the processing unit 16 increases the number of rotations of the wafer W from the predetermined number of rotations R2 to the predetermined number of rotations R3. This enables the processing unit 16 to reduce the film thickness of the rinsing liquid Lr on the wafer W so as to cancel the state in which the protrusion 41b of the top plate portion 41 is in contact with the rinsing liquid Lr (step S16).

Figure 7J:
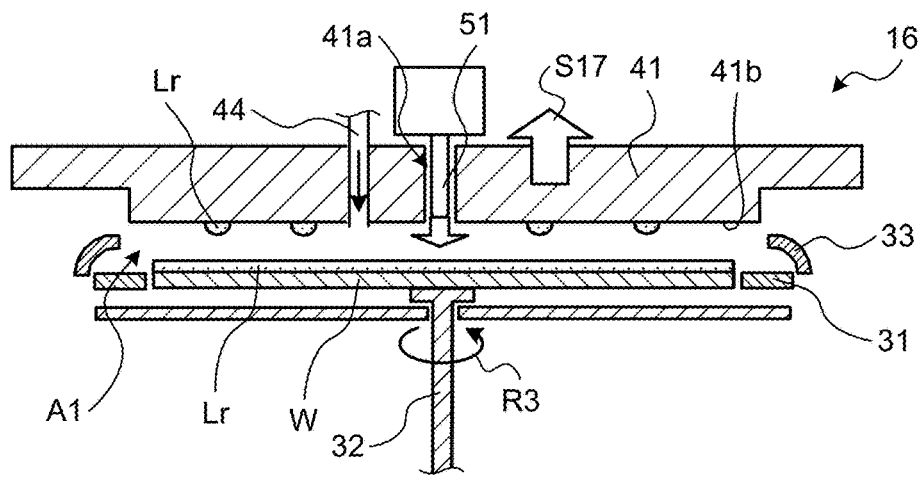
FIG. 7J is a schematic diagram (10) illustrating one step of the liquid processing according to the embodiment.

Subsequently, as illustrated in FIG. 7J, the processing unit 16 raises the top plate portion 41 to a position where the gap between the wafer W and the top plate portion 41 is approximately 4 mm, and separates the top plate portion 41 from the wafer W (step S17).

With this procedure, it is possible in the embodiment to suppress the rising of the wafer W adhering to the top plate portion 41 via the rinsing liquid Lr together with the rising of the top plate portion 41. Furthermore, as illustrated in FIG. 7J, the rinsing liquid Lr adheres to the protrusion 41b of the top plate portion 41 at execution of step S17.

Since steps S16 and S17 are processes similar to steps S11 and S12 illustrated in FIGS. 7D and 7E, other duplicate descriptions will be omitted.

Figure 7K:
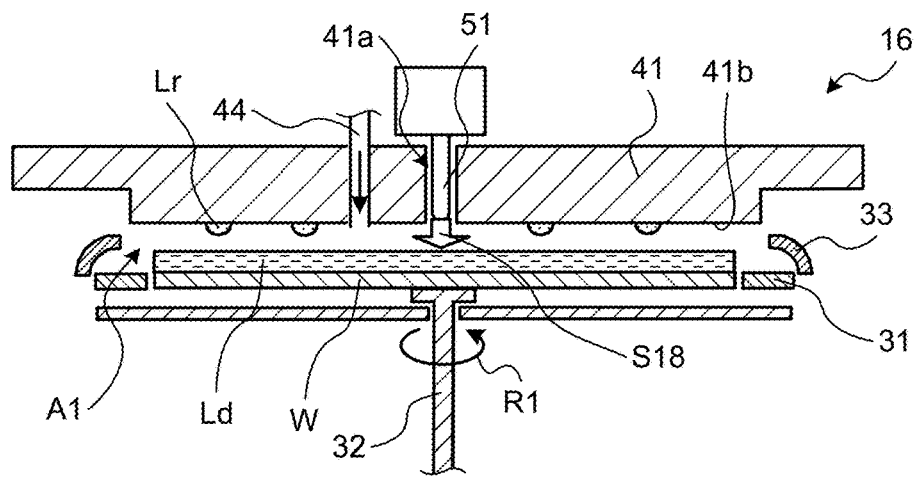
FIG. 7K is a schematic diagram (11) illustrating one step of the liquid processing according to the embodiment.

Next, as illustrated in FIG. 7K, by operating the processing liquid nozzle 51, the processing unit 16 supplies a predetermined drying liquid Ld to the wafer W (step S18). At this time, by operating the substrate holding unit 31, the processing unit 16 rotates the wafer W at the predetermined number of rotations R1.

This allows the drying liquid Ld to move to the outer peripheral side of the wafer W, causing the rinsing liquid Lr on the wafer W to be replaced with the drying liquid Ld.

Figure 7L:
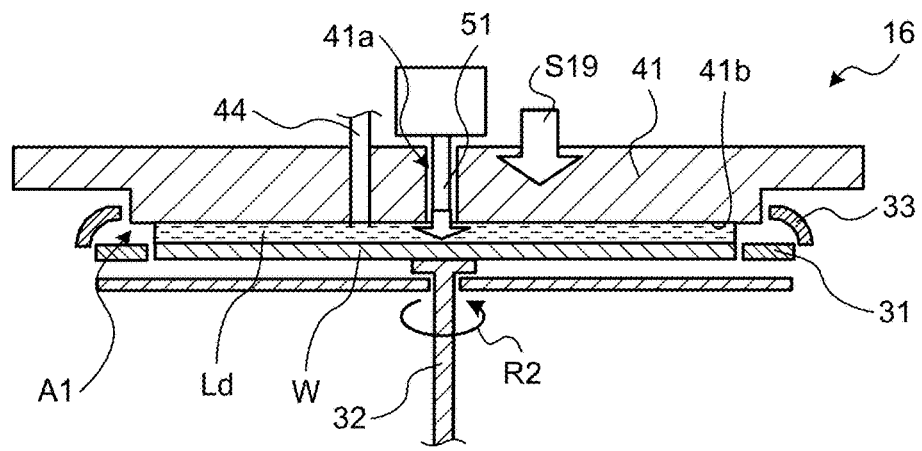
FIG. 7L is a schematic diagram (12) illustrating one step of the liquid processing according to the embodiment.

Next, as illustrated in FIG. 7L, the processing unit 16 lowers the top plate portion 41 to bring it closer to the wafer W while supplying the drying liquid Ld between the wafer W and the top plate portion 41, thereby bringing the protrusion 41b of the top plate portion 41 into contact with the drying liquid Ld on the wafer W (step S19).

With this procedure, the rinsing liquid Lr adhering to the protrusion 41b of the top plate portion 41 can be removed with the drying liquid Ld. In step S19, the gap between the wafer W and the top plate portion 41 is approximately 1 mm, for example. At this time, the processing unit 16 rotates the wafer W at the predetermined number of rotations R2.

Figure 7M:
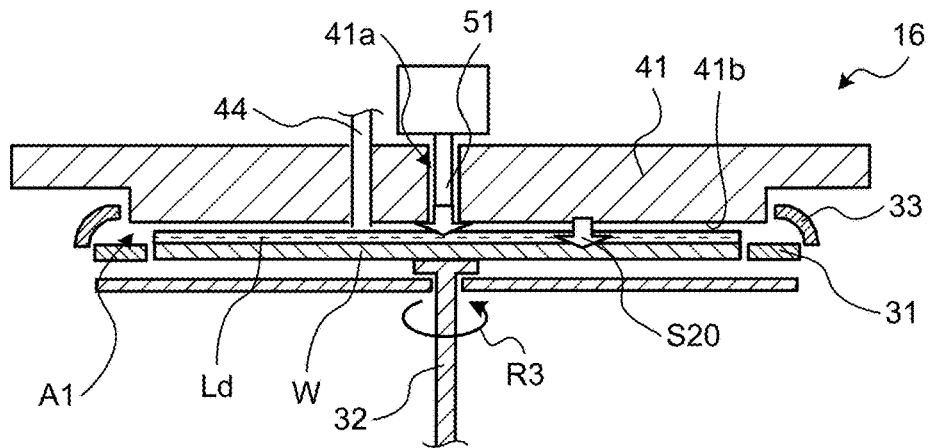
FIG. 7M is a schematic diagram (13) illustrating one step of the liquid processing according to the embodiment.

Next, as illustrated in FIG. 7M, the processing unit 16 increases the number of rotations of the wafer W from the predetermined number of rotations R2 to the predetermined number of rotations R3. This enables the processing unit 16 to reduce the film thickness of the drying liquid Ld on the wafer W so as to cancel the state in which the protrusion 41b of the top plate portion 41 is in contact with the drying liquid Ld (step S20).

Figure 7N:
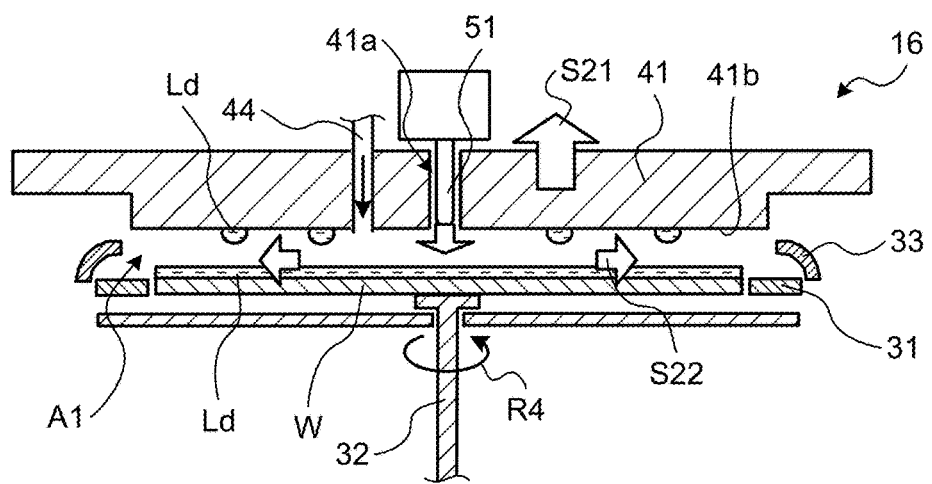
FIG. 7N is a schematic diagram (14) illustrating one step of the liquid processing according to the embodiment.
Figure 7O:
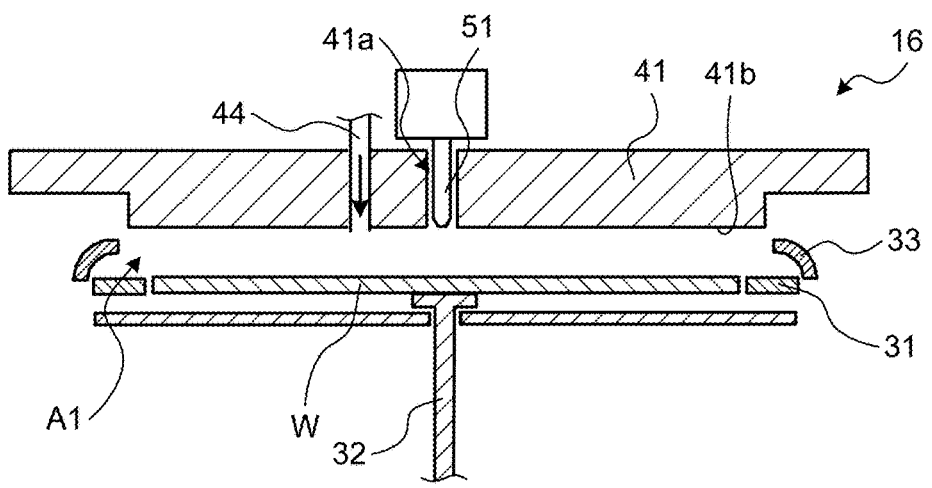
FIG. 7O is a schematic diagram (15) illustrating one step of the liquid processing according to the embodiment.

Subsequently, as illustrated in FIG. 7N, the processing unit 16 raises the top plate portion 41 to a position where the gap between the wafer W and the top plate portion 41 is approximately 4 mm, and separates the top plate portion 41 from the wafer W (step S21).

With this procedure, it is possible in the embodiment to suppress the rising of the wafer W adhering to the top plate portion 41 via the drying liquid Ld together with the rising of the top plate portion 41. Furthermore, as illustrated in FIG. 7N, the drying liquid Ld adheres to the protrusion 41b of the top plate portion 41 at execution of step S21.

To cope with this, by rotating the wafer W at a predetermined number of rotations R4 (for example, about 1000 rpm) greater than the number of rotations R3 while supplying the drying liquid Ld, the processing unit 16 forms a flow of the drying liquid Ld moving toward the outer edge side on the wafer W (step S22).

This leads to formation of an air flow moving toward the outer edge side between the wafer W and the top plate portion 41 so as to be engulfed by the flow of the drying liquid Ld formed on the wafer W, making it possible to blow off the drying liquid Ld adhering to the protrusion 41b of the top plate portion 41. Consequently, according to the embodiment, the top plate portion 41 can be dried by step S22.

Furthermore, in the embodiment, the continuous supply of the drying liquid Ld to the wafer W in the drying process of the top plate portion 41 makes it possible to suppress the contamination of the wafer W by the drying liquid Ld dropped from the top plate portion 41.

Finally, the processing unit 16 stops the supply of the drying liquid Ld to the wafer W and performs spin-drying of the wafer W, leading to achievement of drying the wafer W as illustrated in FIG. 7O.

As described above, in the embodiment, by replacing the rinsing liquid Lr on the wafer W with the drying liquid Ld, it is possible to improve the drying performance of the wafer W. Furthermore, in the embodiment, after replacement with the drying liquid Ld, spin-drying is performed. This not only improves the drying performance of the wafer W but also can promote the drying process of the top plate portion 41. Furthermore, it would be also possible to improve the drying performance by performing replacement with the drying liquid Ld and transferring the wafer W to another drying chamber in a state where the drying liquid Ld is kept on the wafer W.

Although the embodiment is an example in which spin-drying is performed onto the wafer W at the end, it is also allowable to apply IPA being the drying liquid Ld to the wafer W at the end to complete a series of liquid processing.

As described above, in the embodiment, during the steps S8 to S22, the processing unit 16 allows the gas supply unit 44 to operate and continuously supply a predetermined atmosphere adjusting gas to the first space A1 except for the case where the top plate portion 41 is in state being in contact with a liquid. This enables the atmosphere around the wafer W that undergoes liquid processing to be continuously adjusted to a predetermined condition.

In addition, in the embodiment, the ambient atmosphere is supplied to the second space A2 in the case 20, while the atmosphere adjusting gas is supplied exclusively to the first space A1 partitioned by the partition wall 40. Therefore, according to the embodiment, it is possible to reduce the use amount of the atmosphere adjusting gas at the time of liquid processing of the wafer W.

Furthermore, in the embodiment, the rinsing liquid Lr is supplied between the wafer W and the top plate portion 41, and the top plate portion 41 and the wafer W are washed with the rinsing liquid Lr. With this procedure, even when the top plate portion 41 is brought close to the wafer W in order to reduce the use amount of atmosphere adjusting gas, it is possible to suppress contamination of the wafer W by the first processing liquid L1 and the second processing liquid L2 adhering to the top plate portion 41.

Therefore, according to the embodiment, it is possible to reduce the use amount of the atmosphere adjusting gas at the time of liquid processing of the wafer W while ensuring the reliability of the liquid processing.

Furthermore, in the embodiment, it is preferable to wash the top plate portion 41 and the wafer W so that the space between the wafer W and the top plate portion 41 is filled with the rinsing liquid Lr. This enables the rinsing liquid Lr to be brought into contact with the entire surface of the protrusion 41b of the top plate portion 41, leading to achievement of even washing of the protrusion 41b of the top plate portion 41.

Furthermore, in the embodiment, the first space A1 can be narrowed by bringing the top plate portion 41 close to the wafer W and filling the gap of the first space A1 with the gap filling portion 43. Therefore, according to the embodiment, the use amount of the atmosphere adjusting gas can be further reduced.

Furthermore, in the embodiment, the through hole 41a is to be preferably formed so as to face the central portion of the wafer W held by the substrate holding unit 31. This enables the processing liquid nozzle 51 to be arranged above the central portion of the wafer W, making it possible to discharge the processing liquid L toward the central portion of the wafer W. Consequently, according to the embodiment, the processing liquid L can be evenly supplied to the entire surface of the wafer W.

The substrate processing in the processing unit 16 will be continuously described. After a series of liquid processing, the processing unit 16 retracts the top plate portion 41 upward from the wafer W conveying path and retracts the gap filling portion 43 downward so as to ensure the conveying path of the wafer W in the first space A1.

Next, the shutter 22 is moved to open the carry-in/out port 21, and the wafer W is carried out from the processing unit 16 using the substrate transfer device 17. Finally, the processing unit 16 closes the shutter 22 and stops the supply of the atmosphere adjusting gas from the gas supply unit 44.

In this manner, by stopping the supply of the atmosphere adjusting gas to the first space A1 from which the wafer W has been carried out, it is possible to further reduce the use amount of the atmosphere adjusting gas.

Furthermore, in the embodiment, as described above, it is preferable to start the supply of the atmosphere adjusting gas by the gas supply unit 44 before the wafer W is carried in so as to replace the first space A1 with the atmosphere adjusting gas in advance. With this process, the wafer W can be carried into the first space A1 in which the atmosphere has been adjusted.

Furthermore, in the embodiment, the substrate holding unit 31 may be rotated in the first space A1 when the first space A1 is replaced with the atmosphere adjusting gas in advance. This makes it possible to suppress the retention of an atmosphere other than the atmosphere adjusting gas in the first space A1, leading to achievement of efficient replacement of the first space A1 with the atmosphere adjusting gas.

The substrate processing apparatus (processing unit 16) according to the embodiment includes the substrate holding unit 31, the liquid supply section 50, the top plate portion 41, and the controller 18. The substrate holding unit 31 holds and rotates the substrate (wafer W). The liquid supply section 50 supplies the processing liquid (first processing liquid L1, second processing liquid L2) and the rinsing liquid Lr to the substrate (wafer W). The top plate portion 41 is provided so as to face the substrate (wafer W) held by the substrate holding unit 31. The controller 18 controls the substrate holding unit 31, the liquid supply section 50, and the top plate portion 41. The controller 18 supplies the processing liquid (first processing liquid L1, second processing liquid L2) to the substrate (wafer W), and then supplies the rinsing liquid Lr between the substrate (wafer W) and the top plate portion 41 held on the substrate holding unit 31 thereby washing the substrate (wafer W) and the top plate portion 41 with the rinsing liquid Lr. This makes it possible to reduce the use amount of the atmosphere adjusting gas at the time of liquid processing of the wafer W while ensuring the reliability of the liquid processing.

Furthermore, the substrate processing apparatus (processing unit 16) according to the embodiment includes a static elimination mechanism on the top plate portion 41. With this procedure, when the wafer W is rotated with the top plate portion 41 in contact with the liquid, it is possible to suppress electrical charging of the top plate portion 41 by the rinsing liquid Lr.

<Top Plate Portion Washing Process>

Figure 8A:
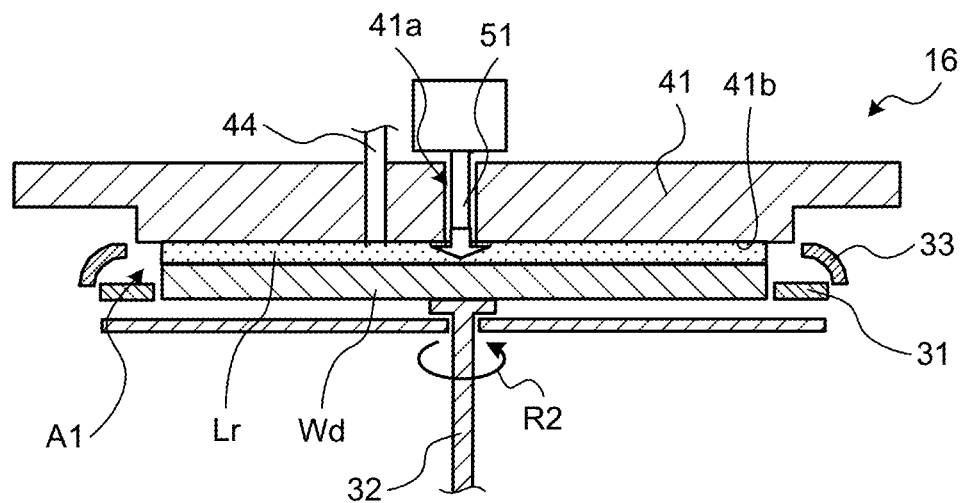
FIG. 8A is a schematic diagram (1) illustrating a washing process of a top plate portion according to the embodiment.
Figure 8B:
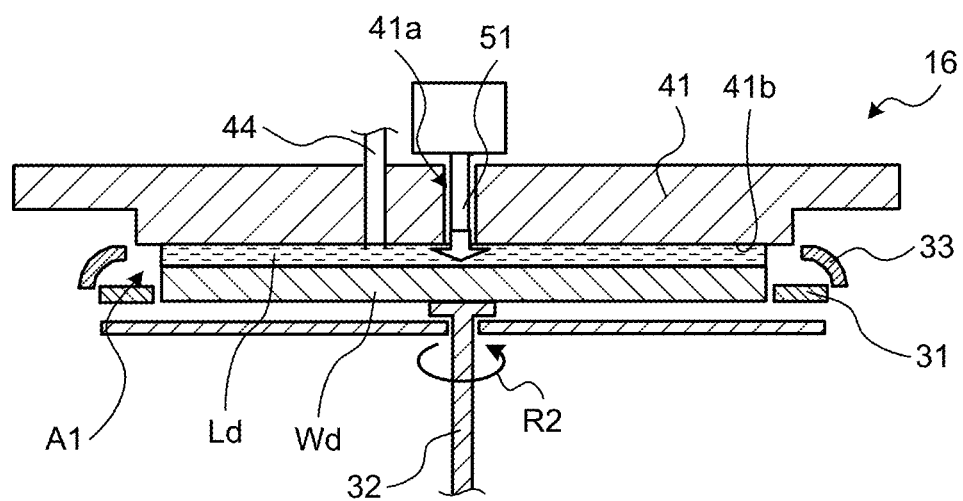
FIG. 8B is a schematic diagram (2) illustrating the washing process of the top plate portion according to the embodiment.

Furthermore, the above embodiment is an example in which the washing process of the top plate portion 41 is performed in parallel with the execution of liquid processing of the wafer W. However, the washing process of the top plate portion 41 may be performed alone and separately from the liquid processing of the wafer W. FIGS. 8A and 8B are schematic diagrams (1) and (2) illustrating a washing process of the top plate portion 41 according to the embodiment.

For example, as illustrated in FIG. 8A, a jig wafer Wd having a diameter equivalent to that of the wafer W is held by the substrate holding unit 31 in the same procedure as the above-described wafer W. Subsequently, the processing unit 16 supplies the rinsing liquid Lr between the jig wafer Wd and the top plate portion 41, and brings the protrusion 41b of the top plate portion 41 into contact with the rinsing liquid Lr on the jig wafer Wd. This makes it possible to perform a washing process on the protrusion 41b of the top plate portion 41 to which the processing liquid adheres.

Next, similarly to the above embodiment, the processing unit 16 increases the number of rotations of the jig wafer Wd from the predetermined number of rotations R2 to the predetermined number of rotations R3. This enables reduction of the film thickness of the rinsing liquid Lr on the jig wafer Wd so as to cancel the state in which the protrusion 41b of the top plate portion 41 is in contact with the rinsing liquid Lr.

Next, by operating the processing liquid nozzle 51, the processing unit 16 supplies a predetermined drying liquid Ld to the jig wafer Wd. This allows the drying liquid Ld to move to the outer peripheral side of the jig wafer Wd, causing the rinsing liquid Lr on the jig wafer Wd to be replaced with the drying liquid Ld.

Subsequently, as illustrated in FIG. 8B, the processing unit 16 supplies the drying liquid Ld between the jig wafer Wd and the top plate portion 41, and brings the protrusion 41b of the top plate portion 41 into contact with the drying liquid Ld on the jig wafer Wd. With this procedure, the rinsing liquid Lr adhering to the protrusion 41b of the top plate portion 41 can be removed with the drying liquid Ld.

Subsequently, similarly to the above embodiment, the processing unit 16 increases the number of rotations of the jig wafer Wd from the predetermined number of rotations R2 to the predetermined number of rotations R3. This enables reduction of the film thickness of the drying liquid Ld on the jig wafer Wd so as to cancel the state in which the protrusion 41b of the top plate portion 41 is in contact with the drying liquid Ld.

Subsequently, similarly to the above embodiment, the processing unit 16 rotates the jig wafer Wd at the predetermined number of rotations R4 greater than the number of rotations R3 while supplying the drying liquid Ld. This forms a flow of the drying liquid Ld directed toward the outer edge side on the jig wafer Wd, leading to formation of an air flow directed toward the outer edge side between the jig wafer Wd and the top plate portion 41 so as to be engulfed by the flow of the drying liquid Ld formed on the jig wafer Wd.

This can blow off the drying liquid Ld adhering to the protrusion 41b of the top plate portion 41, making it possible to dry the top plate portion 41 by using the jig wafer Wd.

For example, as illustrated in FIG. 8A, the thickness of the jig wafer Wd is preferably set to be thicker than that of the wafer W (for example, 4 mm in thickness). With this dimension, the height of the top plate portion 41 can be fixed at the same height as in the normal liquid processing. Therefore, according to the embodiment, it is possible to handle operations only with two height positions of the top plate portion 41, namely, the height used in transferring the jig wafer Wd and the height used in normal liquid processing.

Furthermore, adjustment of the atmosphere to a predetermined condition is not necessary when using the jig wafer Wd, and thus, there is no need to supply the atmosphere adjusting gas to the first space A1 during the liquid processing using the rinsing liquid Lr and the drying liquid Ld. Furthermore, when the top plate portion 41 is dried, normal air instead of the atmosphere adjusting gas can be supplied from the gas supply unit 44 to dry the top plate portion 41. Therefore, according to the embodiment, the use amount of the atmosphere adjusting gas can be further reduced.

Alternative Example

Figures 9, 10:
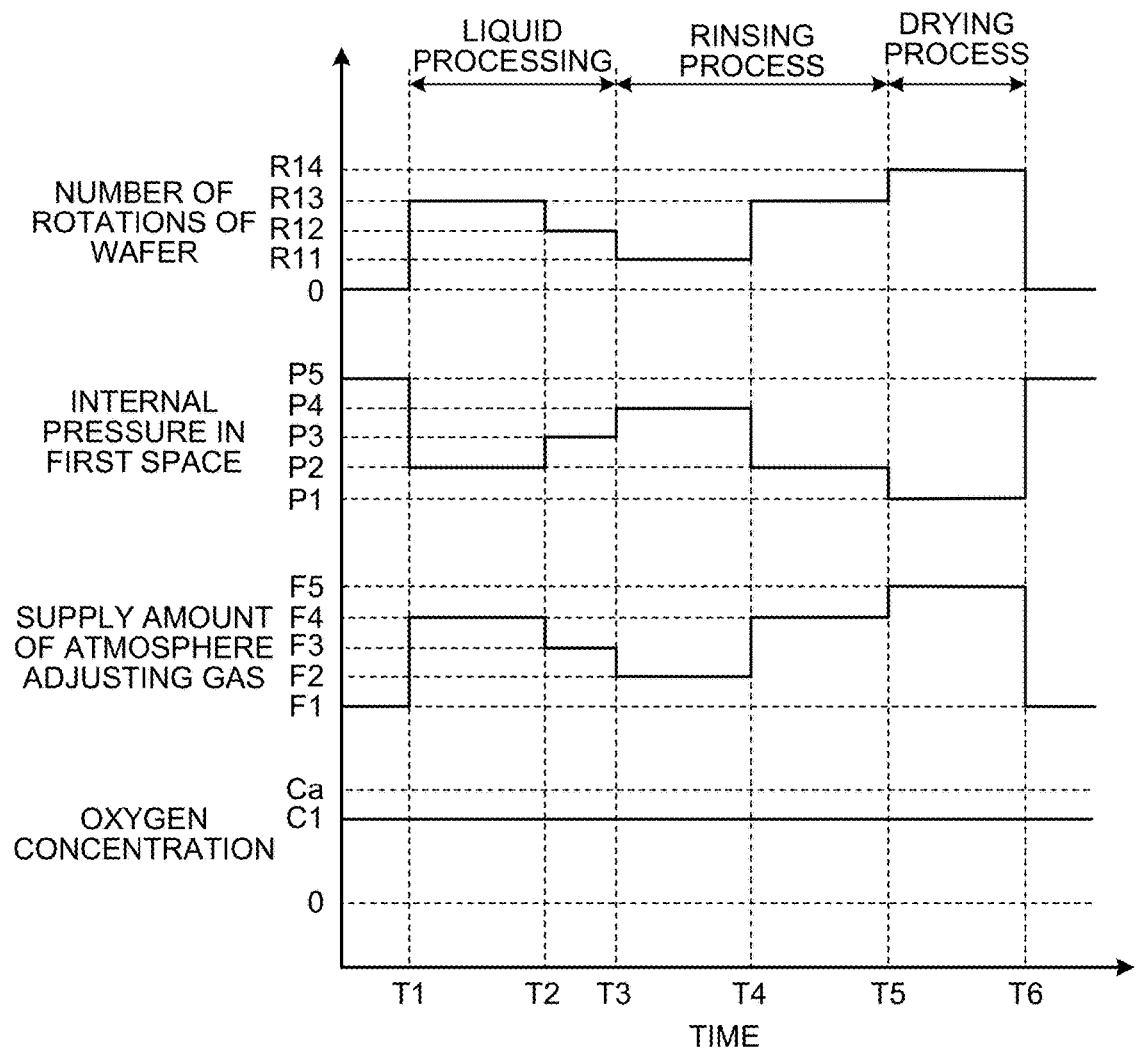
FIG. 9 is a diagram illustrating a relationship between the number of rotations of a wafer, an exhaust pressure, an internal pressure in a first space, and oxygen concentration in a peripheral portion of the wafer according to the embodiment.
FIG. 10 is a timing chart illustrating a status of each of portions in liquid processing according to an alternative example of the embodiment.

Subsequently, substrate processing according to an alternative example of the embodiment will be described with reference to FIGS. 9 and 10. FIG. 9 is a diagram illustrating a relationship between the number of rotations of the wafer, the exhaust pressure, the internal pressure in the first space, and the oxygen concentration in the peripheral portion of the wafer according to the embodiment. FIG. 10 is a timing chart illustrating the status of each of portions in liquid processing according to the alternative example of the embodiment.

As illustrated in FIG. 9, rotating the wafer W by the substrate holding unit 31 makes a negative exhaust pressure out of the first space A1, while making positive internal pressure in the first space A1.

For example, as illustrated in FIG. 10, as the number of rotations of the wafer W increases from zero to the number of rotations R11, R12, R13, and R14, the internal pressure in the first space A1 decreases stepwise, such as pressures P5, P4, P3, P2, and P1. This is because the swirling flow of the wafer W increases together with an increase of the number of rotations of the wafer W.

As illustrated in FIG. 9, as the number of rotations of the wafer W increases, the amount of ambient atmosphere flowing from the second space A2 to the first space A1 will increase, leading to a higher oxygen concentration at the peripheral portion of the wafer W. The oxygen concentration at the peripheral portion of the wafer W illustrated in FIG. 9 indicates the oxygen concentration at a position 150 (mm) from the center of the wafer W.

In the alternative example, the controller 18 controls the gas supply unit 44 to increase the supply amount of the atmosphere adjusting gas together with the increase of the number of rotations of the wafer W. For example, as illustrated in FIG. 10, the controller 18 increases the supply amount of the atmosphere adjusting gas as in the supply amounts F1, F2, F3, F4, and F5 stepwise together with the increase of the number of rotations of the wafer W from zero to the number of rotations R11, R12, R13, and R14.

This makes it possible to set the oxygen concentration in the first space A1 to a constant concentration C1 as illustrated in FIG. 10. Here, the supply amount of the atmosphere adjusting gas is set so that the concentration C1 becomes smaller than an upper limit value Ca of the oxygen concentration in the first space A1.

In this alternative example, as compared with a case where the atmosphere adjusting gas is supplied so that the supply amount of an entire recipe becomes constant at the supply amount F5 to be adapted to the process having the greatest number of rotations in the recipe (drying process in FIG. 10), it is possible to reduce the supply amount of the atmosphere adjusting gas in the entire recipe.

In other words, in this alternative example, by suppressing the oxygen concentration from becoming excessively low with respect to the upper limit value Ca at a small number of rotations, the use amount of the atmosphere adjusting gas in the entire recipe can be reduced.

Incidentally, the adjustment of the supply amount of the atmosphere adjusting gas in the gas supply unit 44 can be performed by controlling a valve and a flow controller (not illustrated) provided in the gas supply unit 44.

Furthermore, although the example of FIG. 10 illustrates an example in which the oxygen concentration in the first space A1 is controlled to be constant at the concentration C1, the control method is not limited to the case where the oxygen concentration in the first space A1 is controlled to be constant at the concentration C1. For example, the supply amount of the atmosphere adjusting gas may be appropriately controlled in accordance with the number of rotations of the wafer W so as to suppress excessively low oxygen with respect to the upper limit value Ca of the oxygen concentration, even with occurrence of some variation in the oxygen concentration in the first space A1.

The substrate processing apparatus (processing unit 16) according to the alternative example of the embodiment further includes a gas supply unit 44 that supplies an atmosphere adjusting gas between the substrate (wafer W) and the top plate portion 41. Furthermore, the controller 18 increases the supply amount of the atmosphere adjusting gas together with an increase of the number of rotations of the substrate (wafer W). This makes it possible to reduce the use amount of atmosphere adjusting gas in the entire recipe.

<Details of Substrate Processing>

Figure 11:
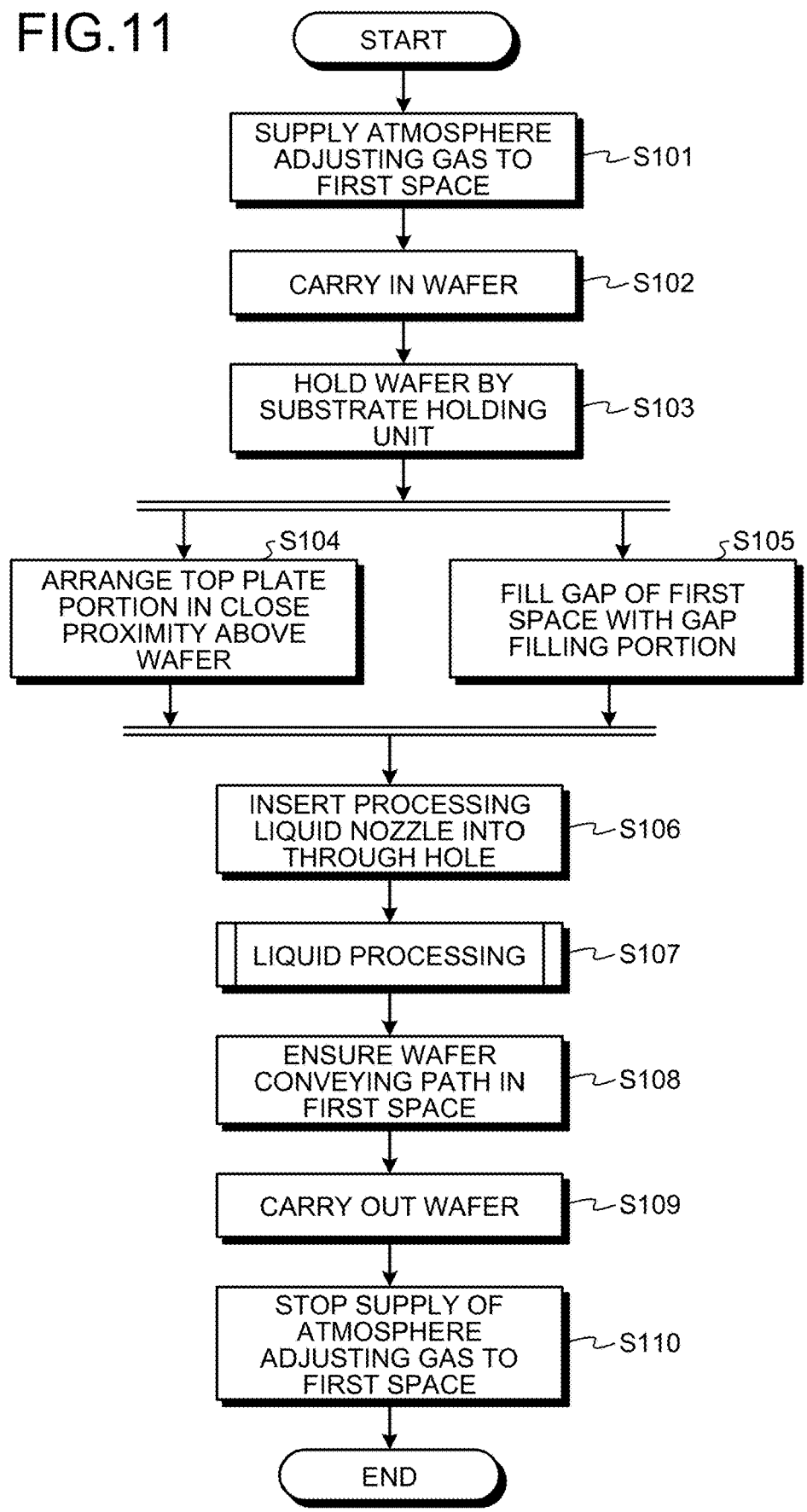
FIG. 11 is a flowchart illustrating a process sequence of entire substrate processing according to the embodiment.

Subsequently, details of the substrate processing according to the embodiment will be described with reference to FIGS. 11 and 12. FIG. 11 is a flowchart illustrating a process sequence of the entire substrate processing according to the embodiment.

First, the controller 18 controls the gas supply unit 44 of the processing unit 16 to supply the atmosphere adjusting gas to the first space A1 partitioned by the partition wall 40 (step S101). Subsequently, the controller 18 controls the substrate transfer device 13 and the substrate transfer device 17 to carry the wafer W from the carrier C into the processing unit 16 via the substrate transfer device 13, the delivery unit 14, and the substrate transfer device 17 (step S102).

Next, the controller 18 controls the substrate processing section 30 of the processing unit 16 to hold the wafer W using the substrate holding unit 31 (step S103). This step S103 is executed by operations including, for example, receiving the wafer W carried in up to the upper part of the substrate holding unit 31 by the supporting unit 32 moved upward, and moving the wafer W downward so as to hold the wafer W by the substrate holding unit 31.

Next, the controller 18 controls the partition wall 40 of the processing unit 16 to arrange the top plate portion 41 in close proximity above the wafer W (step S104). Furthermore, in parallel with the process of step S104, the controller 18 controls the partition wall 40 to fill the gap of the first space A1 with the gap filling portion 43 (step S105).

Next, the controller 18 controls the liquid supply section 50 of the processing unit 16 to insert the processing liquid nozzle 51 into the through hole 41a of the top plate portion 41 (step S106). Subsequently, the controller 18 controls the substrate processing section 30, the top plate portion 41, and the liquid supply section 50 to perform a series of liquid processing on the wafer W (step S107). Details of such step S107 will be described below.

Next, the controller 18 controls the partition wall 40 to ensure a conveying path for the wafer W in the first space A1 (step S108). Such step S108 is performed, for example, by retracting the top plate portion 41 upward from the wafer W conveying path and retracting the gap filling portion 43 downward.

Next, the controller 18 controls the substrate processing section 30, the substrate transfer device 17, and the substrate transfer device 13 so as to carry out the wafer W from the inside of the processing unit 16 to the carrier C via the substrate transfer device 17, the delivery unit 14, and the substrate transfer device 13 (step S109).

Finally, the controller 18 controls the gas supply unit 44 to stop the supply of the atmosphere adjusting gas to the first space A1 partitioned by the partition wall 40 (step S110), and completes the process.

FIG. 12 is a flowchart illustrating a detailed process sequence of a series of liquid processing (step S107 described above) according to the embodiment.

In a series of liquid processing according to the embodiment, the controller 18 first supplies a predetermined first processing liquid L1 between the wafer W and the top plate portion 41 (step S201). This process of supplying the first processing liquid L1 is performed by supplying the first processing liquid L1 from the processing liquid nozzle 51 to the wafer W via the through hole 41a of the top plate portion 41 in a state where the top plate portion 41 is brought close to the position where the gap between the wafer W and the top plate portion 41 is approximately 4 mm.

Next, the controller 18 supplies a predetermined rinsing liquid Lr between the wafer W and the top plate portion 41 (step S202). The process of supplying the rinsing liquid Lr is performed, for example, by supplying the rinsing liquid Lr such as DIW from the processing liquid nozzle 51 to the wafer W via the through hole 41a of the top plate portion 41.

Next, the controller 18 lowers the top plate portion 41 to bring the top plate portion 41 into contact with the rinsing liquid Lr on the wafer W (step S203). The process of bringing the top plate portion 41 into contact with the liquid is performed, for example, by bringing the top plate portion 41 close to a position where the gap between the wafer W and the top plate portion 41 is approximately 1 mm.

Next, the controller 18 reduces the film thickness of the rinsing liquid Lr on the wafer W (step S204). The process of reducing the film thickness of the rinsing liquid Lr is performed, for example, by increasing the number of rotations of the wafer W from the number of rotations R2 to the number of rotations R3.

Next, the controller 18 raises the top plate portion 41 to be separated from the wafer W (step S205). The process of separating the top plate portion 41 from the wafer W is performed, for example, by separating the top plate portion 41 to a position where the gap between the wafer W and the top plate portion 41 is approximately 4 mm.

Next, the controller 18 supplies a predetermined second processing liquid L2 between the wafer W and the top plate portion 41 (step S206). Subsequently, the controller 18 supplies a predetermined rinsing liquid Lr between the wafer W and the top plate portion 41 (step S207).

Next, the controller 18 lowers the top plate portion 41 to bring the top plate portion 41 into contact with the rinsing liquid Lr on the wafer W (step S208). Subsequently, the controller 18 reduces the film thickness of the rinsing liquid Lr on the wafer W (step S209).

Next, the controller 18 raises the top plate portion 41 to be separated from the wafer W (step S210). The processes of steps S206 to S210 are the processes similar to steps S201 to S205 described above.

Next, the controller 18 supplies a predetermined drying liquid Ld between the wafer W and the top plate portion 41 so as to replace the rinsing liquid Lr on the wafer W with the drying liquid Ld (step S211). The process of replacing with the drying liquid Ld is performed, for example, by supplying the drying liquid Ld such as IPA from the processing liquid nozzle 51 to the wafer W via the through hole 41a of the top plate portion 41.

Next, the controller 18 lowers the top plate portion 41 to bring the top plate portion 41 into contact with the drying liquid Ld on the wafer W (step S212). The process of bringing the top plate portion 41 into contact with the liquid is performed, for example, by bringing the top plate portion 41 close to a position where the gap between the wafer W and the top plate portion 41 is approximately 1 mm.

Next, the controller 18 reduces the film thickness of the drying liquid Ld on the wafer W (step S213). The process of reducing the film thickness of the drying liquid Ld is performed, for example, by increasing the number of rotations of the wafer W from the number of rotations R2 to the number of rotations R3.

Next, the controller 18 raises the top plate portion 41 to be separated from the wafer W (step S214). The process of separating the top plate portion 41 from the wafer W is performed, for example, by separating the top plate portion 41 to a position where the gap between the wafer W and the top plate portion 41 is approximately 4 mm.

Next, the controller 18 rotates the wafer W to which the drying liquid Ld is supplied and thereby dries the top plate portion 41 (step S215). Finally, the wafer W is dried by spin-drying (step S216) to complete the process.

The substrate processing method according to the embodiment includes a step of holding the substrate by the substrate holding unit 31 which is rotatable, a step of arranging the top plate portion 41 above the substrate, a step of supplying a processing liquid to the substrate, and a step of supplying a rinsing liquid Lr between the substrate and the top plate portion 41 to wash the substrate and the top plate portion 41 with the rinsing liquid Lr. This makes it possible to reduce the use amount of the atmosphere adjusting gas at the time of liquid processing of the wafer W while ensuring the reliability of the liquid processing.

Furthermore, in the substrate processing method according to the embodiment, the step of washing with the rinsing liquid Lr is a step of filling the space between the substrate (wafer W) and the top plate portion 41 with the rinsing liquid Lr. This enables the rinsing liquid Lr to be brought into contact with the entire surface of the protrusion 41b of the top plate portion 41, leading to achievement of even washing of the top plate portion 41.

Furthermore, in the substrate processing method according to the embodiment, the step of washing with the rinsing liquid Lr includes a step of supplying the rinsing liquid Lr between the substrate (wafer W) and the top plate portion 41 while rotating the substrate (wafer W). In addition, the substrate processing method according to the embodiment further includes, after the step of washing with the rinsing liquid Lr, a step of increasing the number of rotations of the substrate (wafer W) to reduce the film thickness of the rinsing liquid Lr, and a step of raising the top plate portion 41 after the step of reducing the film thickness of the rinsing liquid Lr. With this procedure, it is possible to suppress the rising of the wafer W adhering to the top plate portion 41 via the rinsing liquid Lr together with the rising of the top plate portion 41.

Furthermore, in the substrate processing method according to the embodiment, the rinsing liquid Lr undergoes static elimination before being supplied in the step of washing with the rinsing liquid Lr. With this procedure, when the wafer W is rotated with the top plate portion 41 in contact with the liquid, it is possible to suppress electrical charging of the top plate portion 41 by the rinsing liquid Lr.

Furthermore, the substrate processing method according to the embodiment further includes a step of replacing the rinsing liquid Lr on the substrate (wafer W) with the drying liquid Ld, after the step of washing with the rinsing liquid Lr. This makes it possible to increase the drying performance of the wafer W.

Furthermore, the substrate processing method according to the embodiment further includes a step of supplying an atmosphere adjusting gas between the substrate (wafer W) and the top plate portion 41. This makes it possible to reduce the use amount of the atmosphere adjusting gas at the time of liquid processing of the wafer W.

Furthermore, in the step of supplying the atmosphere adjusting gas in the substrate processing method according to the embodiment, the supply amount of the atmosphere adjusting gas is increased together with an increase of the number of rotations of the substrate (wafer W). This makes it possible to reduce the use amount of atmosphere adjusting gas in the entire recipe.

The embodiments of the present disclosure have been described as above. The present disclosure is not limited to the above embodiments, and various alterations can be made without departing from the scope and spirit of the present disclosure. For example, although the above embodiment is an example of processing with the first processing liquid L1, performing the rinsing process, and thereafter processing with the second processing liquid L2. Alternatively, however, a drying process by IPA may be added between the rinsing process and the process with the second processing liquid L2. In addition, although the embodiment is an example in which spin-drying is performed onto the wafer W at the end, it is also allowable to apply IPA being the drying liquid Ld to the wafer W at the end to complete a series of liquid processing.

It should be considered that the embodiments disclosed here are exemplary in all respects and not restrictive. Indeed, the above-described embodiments may be implemented in various modes or forms. Furthermore, the above-described embodiments may be omitted, replaced, or altered in various forms without departing from the scope and spirit of the appended claims and the purpose thereof.

According to the present disclosure, it is possible to reduce the use amount of the atmosphere adjusting gas at the time of processing the substrate in an atmosphere adjusted in accordance with processing conditions.

The invention claimed is:

1. A substrate processing apparatus configured to wash and rinse a substrate, the substrate processing apparatus comprising:
   a substrate holder that holds and rotates the substrate;
   a liquid supply that supplies a processing liquid and a rinsing liquid to the substrate;
   a movable top plate provided to face the substrate held by the substrate holder, wherein the movable top plate is not connected to any rotation device such that the movable top plate is non-rotatable;
   a top plate movement driver that moves the movable top plate in a vertical direction in response to controls from a controller; and
   the controller configured to control the substrate holder, the liquid supply, and the movable top plate, wherein,
   the controller is configured to supply the processing liquid between the substrate held by the substrate holder and the moveable top plate while rotating the substrate at a predetermined processing rotation speed,
   after the processing liquid has been supplied to the substrate, the controller is configured to supply the rinsing liquid between the substrate held by the substrate holder and the moveable top plate while rotating the substrate at a predetermined rinsing rotation speed,
   after washing the substrate and the moveable top plate with the rinsing liquid, the controller is configured to rotate the substrate at a speed higher than the predetermined rinsing rotation speed to reduce a film thickness of the rinsing liquid, and
   the controller is configured to control the top plate movement driver to raise the moveable top plate after reducing the film thickness of the rinsing liquid.

2. The substrate processing apparatus according to claim 1, wherein the movable top plate includes a static eliminator.

3. The substrate processing apparatus according to claim 1, further comprising a gas supply that supplies an atmosphere adjusting gas between the substrate and the movable top plate,
  wherein the controller is configured to increase a supply rate of the atmosphere adjusting gas together with an increase of a number of rotations per minute of the substrate.

4. The substrate processing apparatus according to claim 1, wherein,
  the controller is configured to control the liquid supply to fill a predefined area between the substrate and the movable top plate with the rinsing liquid to wash the substrate and the movable top plate with the rinsing liquid.

* * * * *